US012647298B2

(12) United States Patent
Scolan

(10) Patent No.: US 12,647,298 B2
(45) Date of Patent: Jun. 2, 2026

(54) CAN BUS INTERCONNECTION CIRCUIT

(71) Applicant: Hill-Rom Services, Inc., Batesville, IN (US)

(72) Inventor: Maxime E. Scolan, Kervignac (FR)

(73) Assignee: Hill-Rom Services, Inc., Batesville, IN (US)

( * ) Notice: Subject to any disclaimer, the term of this patent is extended or adjusted under 35 U.S.C. 154(b) by 41 days.

(21) Appl. No.: 18/763,053

(22) Filed: Jul. 3, 2024

(65) Prior Publication Data

US 2025/0047520 A1 Feb. 6, 2025

Related U.S. Application Data

(60) Provisional application No. 63/529,795, filed on Jul. 31, 2023.

(51) Int. Cl.
*H04L 12/40* (2006.01)
*H03K 17/56* (2006.01)

(52) U.S. Cl.
CPC ....... *H04L 12/40013* (2013.01); *H03K 17/56* (2013.01); *H04L 2012/40215* (2013.01)

(58) Field of Classification Search
None
See application file for complete search history.

(56) References Cited

U.S. PATENT DOCUMENTS

| | | | |
|---|---|---|---|
| 1,017,153 A | 2/1912 | Kampe | |
| 1,043,370 A | 11/1912 | Stubbs | |

| | | | |
|---|---|---|---|
| 1,261,040 A | 4/1918 | Lanes | |
| 1,398,203 A | 11/1921 | Schmidt | |
| 1,440,783 A | 1/1923 | Kiley | |
| 2,245,909 A | 6/1941 | Enfiajian | |
| 2,281,209 A | 4/1942 | Smith | |
| 2,452,366 A | 10/1948 | Freund | |
| 2,477,400 A | 7/1949 | Beem | |
| 2,500,742 A | 3/1950 | Taylor | |
| 2,556,591 A | 6/1951 | Loxley | |

(Continued)

FOREIGN PATENT DOCUMENTS

| | | | |
|---|---|---|---|
| CA | 2303037 | | 3/2000 |
| CN | 2423617 Y | * | 3/2001 |

(Continued)

OTHER PUBLICATIONS

Pinho, Luis Miguel et al., "Reliable Communication in Distributed Computer-Controlled Systems," Reliable Software Technologies—Ada-Europe 2001, 136-147.

(Continued)

*Primary Examiner* — Berhanu Tadese
(74) *Attorney, Agent, or Firm* — Barnes & Thornburg LLP

(57) ABSTRACT

A circuit for interconnecting a first controller area network (CAN) bus with a second CAN bus includes a first CAN transceiver, a second CAN transceiver, and a pair of transistors and six resistors electrically interconnecting the first and second CAN transceivers. The first CAN bus is included in a first device, such a bed to support a person or occupant, and the second CAN bus is included in a second device, such as a mattress supported by the bed. The circuit for interconnecting the first and second CAN busses is situated in an interior region of the mattress.

20 Claims, 8 Drawing Sheets

(56)                References Cited

U.S. PATENT DOCUMENTS

| | | | |
|---|---|---|---|
| 2,564,083 A | 8/1951 | Stechert |
| 2,605,151 A | 7/1952 | Shampaine |
| 2,687,536 A | 8/1954 | Miller |
| 2,719,769 A | 10/1955 | Murphy |
| 2,722,017 A | 11/1955 | Burst |
| 2,734,104 A | 2/1956 | Gollhofer |
| 2,766,463 A | 10/1956 | Bendersky |
| 2,799,545 A | 7/1957 | Berne |
| 2,869,614 A | 1/1959 | Wamsley |
| 3,003,160 A | 10/1961 | Goodman |
| 3,010,121 A | 11/1961 | Breach |
| 3,036,314 A | 5/1962 | Wetzler |
| 3,053,568 A | 9/1962 | Miller |
| 3,099,440 A | 7/1963 | Burzlaff |
| 3,112,500 A | 12/1963 | MacDonald |
| 3,138,805 A | 6/1964 | Piazza |
| 3,174,161 A | 3/1965 | Black |
| 3,195,151 A | 7/1965 | Boyer |
| 3,210,779 A | 10/1965 | Herbold |
| 3,220,021 A | 11/1965 | Nelson |
| 3,220,022 A | 11/1965 | Nelson |
| 3,233,255 A | 2/1966 | Propst |
| 3,239,853 A | 3/1966 | MacDonald |
| 3,309,717 A | 3/1967 | Black |
| 3,317,931 A | 5/1967 | Benoit |
| 3,393,004 A | 7/1968 | Williams |
| 3,406,772 A | 10/1968 | Ahrent |
| 3,456,269 A | 7/1969 | Goodman |
| 3,506,989 A | 4/1970 | Ross |
| 3,526,008 A | 9/1970 | Pruim |
| 3,585,659 A | 6/1971 | Burst |
| 3,593,350 A | 7/1971 | Knight |
| 3,598,947 A | 8/1971 | Osborn |
| 3,599,199 A | 8/1971 | Bunting |
| 3,640,566 A | 2/1972 | Hodge |
| 3,663,772 A | 5/1972 | Grabel |
| 3,665,528 A | 5/1972 | Kjellberg |
| 3,724,003 A | 4/1973 | Kraus |
| 3,767,859 A | 10/1973 | Doering |
| 3,781,843 A | 12/1973 | Harrison |
| 3,814,414 A | 6/1974 | Chapa |
| 3,822,425 A | 7/1974 | Scales |
| 3,845,947 A | 11/1974 | Lee |
| 3,875,598 A | 4/1975 | Foster |
| 3,893,197 A | 7/1975 | Ricke |
| 3,897,973 A | 8/1975 | Long |
| 3,902,204 A | 9/1975 | Lee |
| 3,905,591 A | 9/1975 | Schorr |
| 3,916,461 A | 11/1975 | Kerstholt |
| 3,925,762 A | 12/1975 | Heitlinger |
| 3,932,903 A | 1/1976 | Adams |
| 3,977,664 A | 8/1976 | Mitchell |
| 3,991,414 A | 11/1976 | Moran |
| 3,993,051 A | 11/1976 | Maruyama |
| 4,016,613 A | 4/1977 | Benoit |
| 4,038,709 A | 8/1977 | Kerwit |
| 4,062,075 A | 12/1977 | Stern |
| 4,067,005 A | 1/1978 | Levy |
| 4,078,269 A | 3/1978 | Weipert |
| 4,103,376 A | 8/1978 | Benoit |
| 4,127,906 A | 12/1978 | Zur |
| 4,139,917 A | 2/1979 | Fenwick |
| 4,150,269 A | 4/1979 | Henkel |
| 4,168,099 A | 9/1979 | Jacobs |
| 4,175,263 A | 11/1979 | Triplett |
| 4,179,692 A | 12/1979 | Vance |
| 4,183,109 A | 1/1980 | Howell |
| 4,193,149 A | 3/1980 | Welch |
| 4,195,829 A | 4/1980 | Reser |
| 4,196,425 A | 4/1980 | Williams |
| 4,205,665 A | 6/1980 | Burton |
| 4,216,462 A | 8/1980 | McGrath |
| 4,225,989 A | 10/1980 | Corbett |
| 4,231,030 A | 10/1980 | Weiss |
| 4,231,124 A | 11/1980 | Croxton |
| 4,240,169 A | 12/1980 | Roos |
| 4,258,445 A | 3/1981 | Zur |
| 4,259,782 A | 4/1981 | Proulx |
| 4,264,904 A | 4/1981 | McCoy |
| 4,293,746 A | 10/1981 | Braaten |
| 4,312,500 A | 1/1982 | Jansen |
| 4,336,621 A | 6/1982 | Schwartz |
| 4,345,344 A | 8/1982 | Gadoury |
| 4,354,838 A | 10/1982 | Hoyer |
| 4,369,535 A | 1/1983 | Ekkerink |
| 4,386,254 A | 5/1983 | Eberhardt |
| 4,409,695 A | 10/1983 | Johnston |
| 4,411,035 A | 10/1983 | Fenwick |
| 4,425,673 A | 1/1984 | Werner |
| 4,435,862 A | 3/1984 | King |
| 4,453,732 A | 6/1984 | Assanah |
| 4,463,418 A | 7/1984 | O'Quin, II |
| 4,472,845 A | 9/1984 | Chivetta |
| 4,494,259 A | 1/1985 | Miller |
| 4,539,560 A | 9/1985 | Fleck |
| 4,542,547 A | 9/1985 | Sato |
| 4,545,084 A | 10/1985 | Peterson |
| 4,557,471 A | 12/1985 | Pazzini |
| 4,586,492 A | 5/1986 | Manahan |
| 4,612,679 A | 9/1986 | Mitchell |
| 4,625,345 A | 12/1986 | Wood |
| 4,633,237 A | 12/1986 | Tucknott |
| 4,638,313 A | 1/1987 | Sherwood |
| 4,638,516 A | 1/1987 | Vrzalik |
| 4,653,129 A | 3/1987 | Kuck |
| 4,654,903 A | 4/1987 | Chubb |
| 4,675,926 A | 6/1987 | Lindblom |
| 4,680,753 A | 7/1987 | Fulton |
| 4,680,790 A | 7/1987 | Packard |
| 4,685,159 A | 8/1987 | Oetiker |
| 4,715,385 A | 12/1987 | Cudahy |
| 4,724,555 A | 2/1988 | Poehner |
| 4,745,647 A | 5/1988 | Goodwin |
| 4,751,754 A | 6/1988 | Bailey |
| 4,764,870 A | 8/1988 | Haskin |
| 4,768,241 A | 9/1988 | Beney |
| 4,768,249 A | 9/1988 | Goodwin |
| 4,769,584 A | 9/1988 | Irigoyen |
| 4,797,962 A | 1/1989 | Goode |
| 4,800,384 A | 1/1989 | Snijders |
| 4,803,744 A | 2/1989 | Peck |
| 4,804,950 A | 2/1989 | Moon |
| 4,808,994 A | 2/1989 | Riley |
| 4,811,435 A | 3/1989 | Foster |
| 4,821,470 A | 4/1989 | Kappers |
| 4,829,616 A | 5/1989 | Walker |
| 4,847,929 A | 7/1989 | Pupovic |
| 4,851,625 A | 7/1989 | Liebich |
| 4,856,123 A | 8/1989 | Henderson |
| 4,858,260 A | 8/1989 | Failor |
| 4,858,481 A | 8/1989 | Abraham |
| 4,862,529 A | 9/1989 | Peck |
| 4,862,530 A | 9/1989 | Chen |
| 4,894,876 A | 1/1990 | Fenwick |
| 4,907,845 A | 3/1990 | Wood |
| 4,912,787 A | 4/1990 | Bradcovich |
| 4,934,468 A | 6/1990 | Koerber |
| 4,944,055 A | 7/1990 | Shainfeld |
| 4,949,410 A | 8/1990 | Failor |
| 4,951,032 A | 8/1990 | Langsam |
| 4,953,243 A | 9/1990 | Birkmann |
| 4,974,905 A | 12/1990 | Davis |
| 4,979,183 A | 12/1990 | Cowart |
| 4,985,946 A | 1/1991 | Foster |
| 4,987,897 A | 1/1991 | Funke |
| 4,992,926 A | 2/1991 | Janke |
| 4,998,939 A | 3/1991 | Potthast |
| 5,035,014 A | 7/1991 | Blanchard |
| 5,040,253 A | 8/1991 | Cheng |
| 5,054,141 A | 10/1991 | Foster |
| 5,060,425 A | 10/1991 | Kappers |
| 5,063,624 A | 11/1991 | Smith |
| 5,072,463 A | 12/1991 | Willis |
| 5,074,000 A | 12/1991 | Soltani |

(56)                References Cited

U.S. PATENT DOCUMENTS

| | | | |
|---|---|---|---|
| 5,076,375 A | 12/1991 | Dillon | |
| 5,077,843 A | 1/1992 | Foster | |
| 5,083,332 A | 1/1992 | Foster | |
| 5,083,334 A | 1/1992 | Huck | |
| 5,095,561 A | 3/1992 | Green | |
| 5,103,519 A | 4/1992 | Hasty | |
| 5,105,486 A | 4/1992 | Peterson | |
| 5,109,554 A | 5/1992 | Borders | |
| 5,117,521 A | 6/1992 | Foster | |
| 5,127,034 A | 6/1992 | Wright | |
| 5,129,117 A | 7/1992 | Celestina | |
| 5,137,033 A | 8/1992 | Norton | |
| 5,138,729 A | 8/1992 | Ferrand | |
| 5,148,562 A | 9/1992 | Borders | |
| 5,157,787 A | 10/1992 | Donnellan | |
| 5,157,800 A | 10/1992 | Borders | |
| 5,179,744 A | 1/1993 | Foster | |
| 5,193,633 A | 3/1993 | Ezenwa | |
| 5,204,004 A | 4/1993 | Hayes | |
| D336,577 S * | 6/1993 | Celestina | D6/718.3 |
| 5,216,769 A | 6/1993 | Eakin | |
| 5,224,496 A | 7/1993 | Palmer | |
| 5,230,113 A | 7/1993 | Foster | |
| 5,235,258 A | 8/1993 | Schuerch | |
| 5,235,713 A | 8/1993 | Guthrie | |
| 5,249,270 A | 9/1993 | Stewart | |
| 5,267,364 A | 12/1993 | Volk | |
| 5,269,030 A | 12/1993 | Pahno | |
| 5,269,388 A | 12/1993 | Reichow | |
| 5,276,432 A | 1/1994 | Travis | |
| 5,276,541 A | 1/1994 | Terada | |
| 5,279,010 A | 1/1994 | Ferrand | |
| 5,283,096 A | 2/1994 | Greenberg | |
| 5,285,792 A | 2/1994 | Sjoquist | |
| 5,317,769 A | 6/1994 | Weismiller | |
| 5,319,355 A | 6/1994 | Russek | |
| 5,319,363 A | 6/1994 | Welch | |
| 5,323,565 A | 6/1994 | Kappers | |
| 5,324,900 A | 6/1994 | Gonser | |
| 5,335,651 A | 8/1994 | Foster | |
| 5,348,326 A | 9/1994 | Fullenkamp | |
| 5,353,012 A | 10/1994 | Barham | |
| 5,361,755 A | 11/1994 | Schraag | |
| 5,367,667 A | 11/1994 | Wahlquist | |
| 5,367,728 A | 11/1994 | Chang | |
| 5,370,111 A | 12/1994 | Reeder | |
| 5,375,604 A | 12/1994 | Kelly | |
| 5,394,580 A | 3/1995 | Foster | |
| 5,398,354 A | 3/1995 | Balonick | |
| 5,422,521 A | 6/1995 | Neer | |
| 5,423,231 A | 6/1995 | Helfrich | |
| 5,438,721 A | 8/1995 | Pahno | |
| 5,444,880 A | 8/1995 | Weismiller | |
| 5,450,639 A | 9/1995 | Weismiller | |
| 5,454,126 A | 10/1995 | Foster | |
| 5,465,082 A | 11/1995 | Chaco | |
| 5,471,190 A | 11/1995 | Zimmermann | |
| 5,479,666 A | 1/1996 | Foster | |
| 5,527,097 A | 6/1996 | Martin | |
| 5,537,701 A | 7/1996 | Elliott | |
| 5,542,136 A | 8/1996 | Tappel | |
| 5,542,138 A | 8/1996 | Williams | |
| 5,544,376 A | 8/1996 | Fromson | |
| 5,561,412 A | 10/1996 | Novak | |
| 5,577,279 A | 11/1996 | Foster | |
| 5,579,550 A | 12/1996 | Bathrick | |
| 5,596,437 A | 1/1997 | Heins | |
| 5,611,094 A | 3/1997 | D'Entremont | |
| 5,630,238 A | 5/1997 | Weismiller | |
| 5,636,394 A | 6/1997 | Bartley | |
| 5,642,350 A | 6/1997 | Dailey | |
| 5,653,064 A | 8/1997 | Kappers | |
| 5,664,270 A | 9/1997 | Bell | |
| 5,666,681 A | 9/1997 | Meyer | |
| 5,687,437 A | 11/1997 | Goldsmith | |
| 5,689,839 A * | 11/1997 | Laganiere | A61G 7/0514 |
| | | | 5/426 |
| 5,699,038 A * | 12/1997 | Ulrich | G16H 40/20 |
| | | | 340/286.07 |
| 5,701,618 A * | 12/1997 | Brugger | A61G 3/006 |
| | | | 5/614 |
| 5,715,548 A * | 2/1998 | Weismiller | A61G 7/052 |
| | | | 5/624 |
| 5,720,059 A * | 2/1998 | Allevato | A61G 7/012 |
| | | | 5/610 |
| 5,732,423 A * | 3/1998 | Weismiller | A61G 7/00 |
| | | | 5/430 |
| 5,737,781 A * | 4/1998 | Votel | A61G 7/1015 |
| | | | 5/81.1 R |
| 5,745,937 A * | 5/1998 | Weismiller | A61G 7/018 |
| | | | 5/624 |
| 5,749,123 A * | 5/1998 | Warren | E05F 5/003 |
| | | | 16/83 |
| 5,771,511 A * | 6/1998 | Kummer | A61G 7/018 |
| | | | 5/624 |
| 5,781,949 A * | 7/1998 | Weismiller | A61G 7/053 |
| | | | 5/715 |
| 5,802,636 A * | 9/1998 | Corbin | A61G 7/0509 |
| | | | 5/663 |
| 5,802,640 A * | 9/1998 | Ferrand | A61G 7/0527 |
| | | | 5/607 |
| 5,806,111 A * | 9/1998 | Heimbrock | A61G 1/0225 |
| | | | 280/47.371 |
| 5,808,552 A * | 9/1998 | Wiley | A61B 5/11 |
| | | | 600/595 |
| 5,873,137 A * | 2/1999 | Yavets-Chen | A61G 7/05776 |
| | | | 5/713 |
| 5,878,452 A * | 3/1999 | Brooke | A61G 7/012 |
| | | | 5/663 |
| 5,883,615 A * | 3/1999 | Fago | H01H 3/14 |
| | | | 307/119 |
| 5,890,765 A * | 4/1999 | LaPointe | A47C 1/0355 |
| | | | 297/173 |
| 5,906,016 A * | 5/1999 | Ferrand | A61G 7/05 |
| | | | 177/144 |
| 5,906,017 A * | 5/1999 | Ferrand | A61G 7/0527 |
| | | | 5/613 |
| 5,918,505 A * | 7/1999 | Jensen | F16H 25/2472 |
| | | | 74/89.44 |
| 5,934,280 A * | 8/1999 | Viard | A61G 7/05769 |
| | | | 128/845 |
| 5,939,803 A * | 8/1999 | Frost | H02M 7/155 |
| | | | 307/29 |
| 5,987,671 A * | 11/1999 | Heimbrock | A61G 1/0225 |
| | | | 280/764.1 |
| 6,006,379 A * | 12/1999 | Hensley | A47C 20/08 |
| | | | 5/915 |
| 6,008,598 A * | 12/1999 | Luff | A47C 31/008 |
| | | | 318/16 |
| 6,016,580 A * | 1/2000 | Heimbrock | A61G 1/0287 |
| | | | 5/610 |
| 6,021,533 A * | 2/2000 | Ellis | A61G 7/05769 |
| | | | 5/430 |
| 6,047,423 A * | 4/2000 | Larson | A47C 27/10 |
| | | | 5/709 |
| 6,047,424 A * | 4/2000 | Osborne | A61G 7/018 |
| | | | 5/713 |
| 6,052,754 A * | 4/2000 | Anand | G06F 13/362 |
| | | | 710/305 |
| 6,067,019 A * | 5/2000 | Scott | A61B 5/11 |
| | | | 340/573.5 |
| 6,076,208 A * | 6/2000 | Heimbrock | A61G 7/00 |
| | | | 5/183 |
| 6,085,259 A * | 7/2000 | Rode | H04L 61/00 |
| | | | 710/2 |
| 6,089,593 A * | 7/2000 | Hanson | A61G 7/0528 |
| | | | 297/85 L |
| 6,098,223 A * | 8/2000 | Larson | A47C 27/088 |
| | | | 5/713 |
| 6,131,868 A * | 10/2000 | Welling | G10L 15/26 |
| | | | 5/503.1 |

(56)　　　　　References Cited

U.S. PATENT DOCUMENTS

| | | | | |
|---|---|---|---|---|
| 6,158,295 A * | 12/2000 | Nielsen | F16H 25/2454 | 192/223.4 |
| 6,163,903 A * | 12/2000 | Weismiller | A61G 7/0507 | 5/610 |
| 6,178,576 B1 * | 1/2001 | Newell | A47C 19/045 | 5/663 |
| 6,182,310 B1 * | 2/2001 | Weismiller | A61G 7/0508 | 5/424 |
| 6,185,767 B1 * | 2/2001 | Brooke | A61G 7/0516 | 5/663 |
| 6,208,250 B1 * | 3/2001 | Dixon | A61G 7/0507 | 340/572.1 |
| 6,212,714 B1 * | 4/2001 | Allen | A61G 7/0514 | 5/651 |
| 6,212,718 B1 * | 4/2001 | Stolpmann | A61G 7/05776 | 285/914 |
| 6,223,369 B1 * | 5/2001 | Maier | A61G 7/05769 | 5/713 |
| 6,226,821 B1 * | 5/2001 | Heimbrock | A61G 7/0509 | 5/604 |
| 6,240,583 B1 * | 6/2001 | Brooke | A61G 7/0522 | 5/430 |
| 6,260,221 B1 * | 7/2001 | Grabell | A61G 7/0755 | 5/651 |
| 6,273,771 B1 | 8/2001 | Buckley et al. | | |
| 6,276,011 B1 * | 8/2001 | Antinori | A47C 20/041 | 5/613 |
| 6,279,183 B1 * | 8/2001 | Kummer | A61G 7/16 | 5/617 |
| 6,282,738 B1 * | 9/2001 | Heimbrock | A61G 7/0507 | 5/613 |
| 6,290,194 B1 * | 9/2001 | Chaconas | A47G 9/0215 | 248/346.11 |
| 6,295,675 B1 * | 10/2001 | Ellis | A61G 7/0524 | 5/713 |
| 6,321,878 B1 * | 11/2001 | Mobley | B60B 33/0057 | 188/1.12 |
| 6,336,235 B1 * | 1/2002 | Ruehl | A61G 7/00 | 5/624 |
| 6,351,678 B1 * | 2/2002 | Borders | A61G 13/12 | 700/83 |
| 6,353,950 B1 * | 3/2002 | Bartlett | A61G 7/001 | 5/713 |
| 6,370,448 B1 * | 4/2002 | Eryurek | G05B 19/4185 | 700/282 |
| 6,397,286 B1 * | 5/2002 | Chatenever | G05B 19/0423 | 600/118 |
| 6,438,776 B2 * | 8/2002 | Ferrand | A61G 7/0509 | 177/144 |
| 6,471,363 B2 * | 10/2002 | Howell | F16M 11/24 | 362/11 |
| 6,473,921 B2 * | 11/2002 | Brooke | A61G 7/053 | 5/600 |
| 6,484,221 B1 * | 11/2002 | Lorinser | G06F 13/423 | 710/200 |
| 6,496,993 B2 * | 12/2002 | Allen | A61G 7/0507 | 5/624 |
| 6,539,566 B1 * | 4/2003 | Hayes | A61G 7/002 | 5/607 |
| 6,559,783 B1 * | 5/2003 | Stoneking | H03M 1/1225 | 341/120 |
| 6,606,670 B1 * | 8/2003 | Stoneking | G06F 8/654 | 710/14 |
| 6,611,979 B2 * | 9/2003 | Welling | A61G 7/0509 | 5/624 |
| 6,629,247 B1 * | 9/2003 | Hall | H02J 9/06 | 370/395.42 |
| 6,631,431 B1 * | 10/2003 | Silvkoff | H04L 47/10 | 710/308 |
| 6,639,623 B2 * | 10/2003 | Howell | F16M 13/027 | 362/11 |
| 6,658,680 B2 * | 12/2003 | Osborne | A61G 7/002 | 5/425 |
| 6,684,427 B2 * | 2/2004 | Allen | A61G 7/002 | 5/624 |
| 6,691,346 B2 * | 2/2004 | Osborne | A61G 7/052 | 5/616 |
| 6,798,341 B1 * | 9/2004 | Eckel | H05B 47/175 | 340/517 |
| 6,880,189 B2 * | 4/2005 | Welling | G01G 19/445 | 5/624 |
| 6,899,442 B2 * | 5/2005 | Howell | A61G 12/004 | 362/147 |
| 6,910,236 B2 * | 6/2005 | Rene | A61G 7/015 | 5/651 |
| 6,957,461 B2 * | 10/2005 | Osborne | A61G 7/002 | 5/616 |
| 6,978,500 B2 * | 12/2005 | Osborne | A61G 7/0755 | 5/611 |
| 7,000,272 B2 * | 2/2006 | Allen | A61G 7/0519 | 5/624 |
| 7,017,208 B2 * | 3/2006 | Weismiller | A61G 7/0527 | 5/658 |
| 7,028,352 B2 * | 4/2006 | Kramer | A61G 7/053 | 428/430 |
| 7,171,708 B2 * | 2/2007 | Osborne | A61G 7/0514 | 5/624 |
| 7,213,279 B2 * | 5/2007 | Weismiller | A61G 7/002 | 5/624 |
| 7,216,384 B2 * | 5/2007 | Allen | A61G 7/053 | 5/624 |
| 7,218,497 B2 * | 5/2007 | Bolz | H04L 25/08 | 361/119 |
| 7,237,287 B2 * | 7/2007 | Weismiller | A61G 7/018 | |
| 7,296,312 B2 * | 11/2007 | Menkedick | A61G 7/0524 | 5/611 |
| 7,406,731 B2 * | 8/2008 | Menkedick | A61G 7/0524 | 5/618 |
| D585,834 S | 2/2009 | Mason | | |
| 7,506,390 B2 * | 3/2009 | Dixon | A61G 7/0524 | 5/713 |
| 7,533,429 B2 | 5/2009 | Menkedick | | |
| D595,734 S | 7/2009 | Son | | |
| D598,054 S | 8/2009 | Grimshaw | | |
| 8,314,781 B2 * | 11/2012 | Pittenger | G16H 40/63 | 345/174 |
| 8,705,527 B1 * | 4/2014 | Addepalli | H04W 72/20 | 370/389 |
| 8,710,950 B2 * | 4/2014 | Lubbers | A61G 7/0506 | 340/13.24 |
| 8,717,181 B2 * | 5/2014 | Tallent | G08B 25/008 | 5/940 |
| 9,203,640 B2 | 12/2015 | Xi | | |
| 9,960,930 B2 * | 5/2018 | Riedel | H04L 12/40013 | |
| 10,363,182 B2 * | 7/2019 | Zerhusen | A61G 7/018 | |
| 10,880,117 B2 | 12/2020 | Premanath | | |
| 10,966,889 B2 * | 4/2021 | Ribble | A61G 7/057 | |
| 11,023,407 B2 | 6/2021 | Williams | | |
| 11,357,683 B2 | 6/2022 | Bobey | | |
| 11,571,347 B2 * | 2/2023 | Zerhusen | A61G 7/0503 | |
| 11,712,385 B2 * | 8/2023 | Zerhusen | A61G 7/0513 | 5/503.1 |
| 12,042,452 B2 * | 7/2024 | Wiggermann | A61G 7/05769 | |
| 2001/0001163 A1 | 5/2001 | Allen | | |
| 2001/0011393 A1 | 8/2001 | Brooke | | |
| 2001/0011394 A1 | 8/2001 | Heimbrock | | |
| 2001/0029628 A1 | 10/2001 | Ferrand | | |
| 2001/0032362 A1 | 10/2001 | Welling | | |
| 2002/0002742 A1 | 1/2002 | Osborne | | |
| 2002/0013965 A1 | 2/2002 | Wilson | | |
| 2002/0014951 A1 | 2/2002 | Kramer | | |
| 2002/0059679 A1 | 5/2002 | Weismiller | | |
| 2002/0066142 A1 | 6/2002 | Osborne | | |
| 2002/0080037 A1 | 6/2002 | Dixon | | |
| 2002/0092096 A1 | 7/2002 | Heimbrock | | |
| 2002/0166088 A1 | 11/2002 | Dierauer et al. | | |
| 2003/0051291 A1 | 3/2003 | Brooke | | |
| 2003/0051292 A1 | 3/2003 | Ferrand | | |

(56) References Cited

U.S. PATENT DOCUMENTS

| | | |
|---|---|---|
| 2003/0088920 A1 | 5/2003 | Allen |
| 2003/0093860 A1 | 5/2003 | Kramer |
| 2003/0214953 A1 | 11/2003 | El-Demerdash |
| 2004/0034936 A1 | 2/2004 | Welling |
| 2004/0128765 A1 | 7/2004 | Osborne |
| 2004/0143677 A1 | 7/2004 | Novak |
| 2004/0177445 A1 | 9/2004 | Osborne |
| 2004/0221391 A1 | 11/2004 | Allen |
| 2005/0172405 A1 | 8/2005 | Menkedick |
| 2005/0273940 A1 | 12/2005 | Petrosenko |
| 2006/0075559 A1 | 4/2006 | Skinner |
| 2006/0075560 A1 | 4/2006 | Osborne |
| 2006/0096029 A1 | 5/2006 | Osborne |
| 2006/0096030 A1 | 5/2006 | Allen |
| 2006/0162079 A1 | 7/2006 | Menkedick |
| 2006/0168730 A1 | 8/2006 | Menkedick |
| 2006/0168731 A1 | 8/2006 | Menkedick |
| 2006/0179579 A1 | 8/2006 | Phillips |
| 2007/0010719 A1 | 1/2007 | Huster |
| 2007/0130692 A1 | 6/2007 | Lemire |
| 2007/0169271 A1 | 7/2007 | Allen |
| 2008/0010748 A1 | 1/2008 | Menkedick |
| 2008/0028533 A1 | 2/2008 | Stacy |
| 2008/0189865 A1 | 8/2008 | Bhai |
| 2008/0201847 A1 | 8/2008 | Menkedick |
| 2014/0129047 A1* | 5/2014 | Barrett .................. H04W 4/046 |
| | | 701/1 |
| 2016/0254925 A1* | 9/2016 | Riedel ................... H04W 76/10 |
| | | 710/110 |
| 2018/0185224 A1* | 7/2018 | Ribble ............... A61G 7/05746 |
| 2019/0314231 A1* | 10/2019 | Zerhusen ............. A61G 7/0533 |
| 2020/0030611 A1 | 1/2020 | Vaiarello |
| 2020/0261291 A1* | 8/2020 | Zerhusen ............. A61G 7/0503 |
| 2021/0232463 A1* | 7/2021 | Kulkarni ................. H04L 12/40 |
| 2022/0331180 A1* | 10/2022 | Wiggermann ..... A61G 7/05769 |
| 2023/0277397 A1* | 9/2023 | Monson ................... A61G 7/08 |
| | | 180/6.2 |
| 2023/0320913 A1* | 10/2023 | Zerhusen ............. A61G 7/0503 |
| | | 5/503.1 |
| 2024/0071098 A1* | 2/2024 | Wolfe .................... G06V 20/58 |
| 2025/0041137 A1* | 2/2025 | Scolan ................... G09G 5/003 |
| 2025/0047520 A1* | 2/2025 | Scolan ............... H04L 12/4625 |

FOREIGN PATENT DOCUMENTS

| | | | | |
|---|---|---|---|---|
| CN | 201427527 Y | * | 3/2010 | |
| CN | 102009627 B | * | 7/2013 | |
| CN | 204357414 U | * | 5/2015 | |
| CN | 204906433 U | | 12/2015 | |
| CN | 107825929 A | * | 3/2018 | .......... B60G 17/015 |
| CN | 207291566 U | * | 5/2018 | |
| CN | 213218400 U | | 5/2021 | |
| CN | 213941232 U | * | 8/2021 | .......... A61G 7/0573 |
| CN | 215268308 U | | 12/2021 | |
| CN | 113506428 B | | 2/2023 | |
| CN | 119816278 A | * | 4/2025 | ............ G08B 21/02 |
| DE | 2310603 A1 | | 9/1974 | |
| DE | 40 25 834 A1 | | 2/1992 | |
| DE | 19722115 A1 | * | 12/1998 | ............ H04L 61/00 |
| DE | 19900602 | | 7/2000 | |
| DE | 19722115 C2 | * | 6/2003 | ........ B60R 16/0315 |
| EP | 037063 | | 10/1981 | |
| EP | 0218301 | | 4/1987 | |
| EP | 0338689 | | 10/1989 | |
| EP | 0349067 | | 10/1990 | |
| EP | 0529926 A1 | | 3/1993 | |
| EP | 0341570 | | 8/1994 | |
| EP | 0657154 | | 6/1995 | |
| EP | 0485362 | | 4/1996 | |
| EP | 0558108 | | 9/1996 | |
| EP | 4507251 A1 | * | 2/2025 | ............ H03K 17/56 |
| GB | 1466080 | | 3/1977 | |
| GB | 1595945 | | 8/1981 | |
| GB | 2015872 | | 3/1982 | |

| | | | | |
|---|---|---|---|---|
| GB | 2169195 | | 7/1986 | |
| GB | 2313303 | | 4/2000 | |
| JP | 02109563 | | 4/1990 | |
| JP | 02154760 | | 6/1990 | |
| JP | 02156950 | | 6/1990 | |
| JP | 02200262 | | 8/1990 | |
| JP | 03155862 | | 7/1991 | |
| JP | 07124201 | | 5/1995 | |
| JP | 08280747 | | 10/1996 | |
| JP | 10005284 | | 1/1998 | |
| JP | H1153294 A | * | 2/1999 | ....... H04L 29/12009 |
| JP | 3093005 | | 10/2000 | |
| JP | 3186212 | | 7/2001 | |
| JP | 3237976 | | 12/2001 | |
| JP | 5337515 | | 11/2013 | |
| JP | 6498096 B2 | | 4/2019 | |
| KR | 101384639 B1 | | 4/2014 | |
| KR | 20210096543 A | * | 8/2021 | ............ H04L 12/40 |
| RU | 2454710 C2 | * | 6/2012 | ....... H04L 12/40013 |
| WO | WO 97/26750 | | 7/1997 | |
| WO | WO 9817153 | | 4/1998 | |
| WO | WO 9915126 | | 4/1999 | |
| WO | WO 0007537 | | 2/2000 | |
| WO | WO 0069386 | | 11/2000 | |
| WO | WO 01047340 | | 7/2001 | |
| WO | WO 0162151 | | 8/2001 | |
| WO | WO 03079953 | | 10/2003 | |
| WO | WO 03088885 | | 10/2003 | |
| WO | WO-2004021952 A2 | * | 3/2004 | .......... A61G 7/0527 |

OTHER PUBLICATIONS

Kirk, Brian, "Using Software Protocols To Mask Can Bus Insecurities," IEE Colloquium on Electromagnetic Compatibility Of Software (Ref. No. 1998/471) Date of Conference: Nov. 12, 1998.

Lees, Geoff, "Led by Automotive Industry, CAN Is Beginning To Take Hold," Electronic Buyer's News, 1996, n 1035, p. 16.

Lian, Feng-Li, et al., "Performance Evaluation of Control Networks: Ethernet, ControlNet, and DeviceNet," IEEE Control Systems, vol. 21, Issue: 1, pp. 66-83, Feb. 2001.

Murrya, Charles J., "Automakers split support for safety data buses," Electronic Engineering Times, 2001, n 1186, p. 4.

Navet, N., "Controller are network CANs use within automobiles," IEEE Potentials, vol. 17, Issue 4, Oct./Nov. 1998, pp. 12-14.

Cena, G. and Valenzano, A., "An Improved CAN Fieldbus for Industrial Applications," IEEE Transactions on Industrial Electronics, vol. 44, Issue 4, pp. 553-564, Aug. 1997.

Tindelll, K. et al., "Calculating Controller Area Network (CAN) Message Response Times" Distributed Computer Control Systems 1994, IFAC Workshop, pp. 29-34.

Pinho, Luis Miguel et al., "Timing Analysis of Reliable Real-Time Communication in CAN Networks," 13th Euromicro Conference on Real-Time Systems, 1001, pp. 103-114.

Bello, Lucia Lo et al., "Randomization-Based Approaches for Dynamic Priority Scheduling of Aperiodic Messages on a CAN Network," Languages, Compilers, and Tools for Embedded Systems, vol. 1985, 2001, pp. 1-18.

Navet, B. Gaujal N., "Fault Confinement Mechanisms on CAN: Analysis and Improvements," Fieldbus Systems and Their Applications 2001 (FeT'2001) Proceedsings volume from the 4th IFAC Conference, 2002, pp. 83-90.

Rauchapt, L., "Performance Analysis of CAN Based Systems," ICC 94, 1st Internat. CAN Conf., Proc., Aug. 18, 1994.

Pinho, Luis Miguel et al., "Improved Fault Tolerant Broadcasts in CAN," ETFA 2001. 8th International Conference on Emerging Technologies and Factory Automation. Proceedings, p. 305-13, vol. 1.

Cena, Gianluca et al., "A Distributed Mechanism to Improve Fairness in CAN Networks," Proceedings. 1995 IEEE International Workshop on Factory Communication Systems, WFCS'95 Inclusive, pp. 3-11.

Torngren, Martin, "A perspective to the Design of Distributed Real-time Control Applications based on CAN," ICC 95, 2nd Internat. CAN Conf., Proc., London, GB, Oct. 3-4, 1995.

(56) References Cited

OTHER PUBLICATIONS

Rufino, Jose et al., "A Study on the Inaccessibility Characteristics of the Controller Area Network," ICC 95, 2$^{nd}$ Internat. CAN Conf., Proc., London, GB. Oct. 3-4, 1995.

Fredriksson, Lars-Berno, "What Shall We Focus on in the Next Five Years?," Real-Time Computing. Proceedings of the NATO Advanced Study Institute, pp. 653-655, 1994.

Rufino, Jose et al., Fault-Tolerant Broadcasts in CAN, 28$^{th}$ Annual International Symposium on Fault-Tolerant Computing, Jun. 23-25, 1998, IEEE Computer Society, pp. 150-159.

Grillo, Jean B., "A Bit Mundane Perhaps, But Hospital Beds, Furniture Business Steady and GROWING," DOTmedbusiness news/ Dec. 2007, pp. 20-22 and 33.

5$^{th}$ Anniversary CIA 1992-1997, CAN Application Spotlights, Controller Area Network (CAN) and CAN in Automotion (CIA), CAN in Automation, Operations Structures, CIA Rules, Services, Application Form.

Draft of "Stryker's Preliminary Invalidity Contentions For U.S. Pat. No. 7,506,390, U.S. Pat. No. 7,520,006, and U.S. Pat. No. 7,669,263," 66 pages.

Thomas, Jr., L.J. et al., "Continuous Monitoring of Physiologic Variables with a Dedicated Minicomputer," Biomedical Computer Laboratory, Washington University School of Medicine, St. Louis, MO, Jul. 1975.

Griffith, D.W. et al., "A Microprocessor-Based Tilting Bed for Blood Pressure Control," IEEE, 1979.

VanDoren, A., "Data Acquisition Systems," Reston Publishing Company, Inc., 1982.

Barbenel, J.C. et al., "Monitoring the Mobility of Patients in Bed," Medical & Biological Engineering & Computing, Sep. 1985.

Tamura, T. et al., "A Bed Temperature Monitoring System for Assessing Body Movement During Sleep," Institute of Physical Sciences in Medicine, 1988.

Maibaum, N. et al., "JXTA: A Technology Facilitating Mobile Peer-to-Peer Networks," IEEE, 2002.

Shabot, M. et al., "An Automatic PDMS Interface for the Urotrack Plus 220 Urimeter," The Departments of Surgery and Nursing, Cedars-Sinai Medical Center, Jul. 15, 1987.

Leyerle, B. et al., "The PDMS as a Focal Point for Distributed Patient Data," Intl. Journal of Clinical Monitoring and Computing, 1988.

Hawley, W. et al., "Clinical Implementation of an Automated Medical Information Bus in an Intensive Care Unit," LDS Hospital Salt Lake City, UT, 1988.

Tariq, H. et al., Implementation of MIB at LDS Hospital, IEEE Engineering In Medicine & Biology Society (10$^{th}$ Annual International Conference), 1988.

Tompkins, W.J. et al., "Interfacing Sensors to the IMB PC," Prentice Hall, 1988.

Vincent, P. et al., "Digital Communications and Process Control Transmitters," IEEE Colloquium on 'Measurements We Couldn't Make Without a Micro', 1988.

Shabot, M., "Standardized Acquisition of Bedside Data: The IEEE P1073 Medical Information Bus," International Journal of Clinical Monitoring and Computing, 6: 197-204, 1989.

Franklin, D. et al., "Proposed Standard IEEE P1073 Medical Information Bus Medical Device to Host Computer Interface, Network Overview and Architecture," IEEE, 1989.

Markwalter, B. et al., "CEBUS Network Layer Description," IEEE Transactions on Consumer Electronics, 1989.

Wittenber, J. et al., "The Medical Device Data Language For The P1073 Medical Information Bus Standard," Intl. Journal of Clinical Monitoring and Computing, 1990.

Gardner, M. et al., "Computerized ICU Data Management: Pitfalls and Promises," Kluwer Academic Publishers, 1990.

Gardner, R. "Patient-Monitoring Systems," Medical Informatics, Computer Applications in Health Care, 1990.

Gage, J.S et al., "Automated Anesthesia Surgery Medical Record System," International Journal of Clinical Monitoring and Computing 7: 259-263, 1990.

Nolan, L.S. et al., "The P1073 Medical Information Bus Standard: Overview and Benefits for Clinical Users," Symposium on Computer Application in Medical Care: 216-219, 1990.

Stanton, K. B. et al., "PSUBOT—A Voice-Controlled Wheelchair for the Handicapped," Proceedings of the 33$^{rd}$ Midwest Symposium on Circuits and Systems: 669-672, 1990.

Clemmer, T. et al., "Medical Informatics in the Intensive Care Units: State of the Art 1991," Kluwer Academic Publishers, Oct. 25, 1991.

Gardner, R. et al., "Real Time Data Acquisition: Recommendations For The Medical Information Bus (MIB)," Kluwer Academic Publishers, Dec. 16, 1991.

Kampmann, J. et al., "Connection of Electronic Medical Devices in ICU According to the Standard "MIB,"" International Journal of Clinical Monitoring and Computing 8: 163-166, 1991.

Kampmann, K. et al., "Application of the Ideas of SMDC (IEEE P 1073) Pertaining to the Project "ALODIN/MCARE" and a Medical Device of the Urine Collection Class," Proceedings of the Annual International Conference of the IEEE and Biology Society: 2438-2439, 1992.

Jean, F. et al., "Distribution and Communication in Software Engineering Environments. Application to the HELIOS Software Bus," AMIA, Inc. 1992.

Echelon Networking Contol,: IEE Review, Oct. 1992.

Howarth, M. "Youv'e Got to Have HART," Assembly Automation, 1992.

Stryker, "MPS Acute Care Bed—Model 3000—the First Truly Modular Patient System," Nov. 1993.

Stryker, "Modular Patient System (MPS) 3000 Bed—Maintenance Manual," Oct. 1993.

Stryker, "Modular Patient Systems (MPS) 3000 Bed—Operations Manual," Jul. 1983.

Toncich, D., "Data Communications and Networking for Manufacturing Industries," Chrystobel Engineering, 1993.

"CAN in Automation—International Users' and Manufacturers' Group," CAN in Automation, Mar. 1992.

Wilson, R., "Chips Push CAN Bus into Embedded World," Electronic Engineering Times, Aug. 24, 1992.

Curran, P. et al., "An Approach to Verifying Concurrent Systems—A Medical Information Bus (MIB) Case Study," Fifth Annual IEEE Symposium on Computer-Based Medical Systems: 74-83, Jun. 1992.

Van Woerden, J.A., "A Safe and Easy to Use Integrated Control and Communication Method, M3S," IOS Press, 1993.

Upender, B., "Embedded Communication Protocol Options," Proceedings of the Fifth Annual Embedded System Conference—vol. 2, 1993.

Jordan, J.R., "Transducer Interconnection with a Standard Fieldbus," Strain, Nov. 1993.

Dorf(ed.), R., "Data Acquisition," The Electrical Engineering Handbook: 1799-1807, 1993.

Salvador, C.H. et al., "An Implementation of the IEEE Medical Information Bus Standard," IEEE Engineering in Medicine and Biology, vol. 12, No. 2, 81-88, Jun. 1993.

Nelisse, M.W., "M3S, A CAN System for Wheelchairs," CAN Newsletter, Apr. 1994.

Van Woerden, J.A. et al., "M3S—A Standard Communication Architecture For Rehabilitation Applications," Computing & Control Engineering Journal, Oct. 1994.

Cordonnier, C. et al., "Highly Integrated Cost-Effective CAN," CAN in Automation, 1994.

Kennelly, R.J. et al., "New IEEE Standard Enables Data Collection for Medical Applications," Proceedings of the 18$^{th}$ Annual Symposium on Computer Applications in Medical Care: 531-535, 1994.

Embacher, M., "DC Motor Control in Vehicle Body Applications as a Practical Example of a Cost Competitive CAN Networking Solution," CAN in Automation, 1994.

Karkkainen, P. et al., "SLIO Based Data Acquisition in Testing Brakes of Trucks," CAN in Automation, 1994.

Waizmann, G. et al., "CAN-base for New Applications in Vehicles," CAN in Automation, 1994.

Ligier, Y. et al., "Object-Oriented Design of Medical Imaging Software," Computerized Medical Imaging and Graphics, vol. 18, No. 2, 125-135, 1994.

(56) References Cited

OTHER PUBLICATIONS

Mitsuishi, M et al., "Development of an Inter-World Tele-Micro-Surgery System with Operational Environment Information Transmission Capability," Proceedings of the 1995 IEEE International Conference on Robotics and Automation: 3081-3088, May 1995.
Lawrenz, W., "Worldwide Status of CAN—Present and Future." CAN in Automation, 1995.
Stock, M., "CAN in Flight Simulators," CAN in Automation, 1995.
Cooper, R., "Intelligent Control of Power Wheelchairs," IEEE Engineering in Medicine and Biology, Jul./Aug. 1995.
Baribaud, G. et al., "Recommendations For the Use of Fieldbuses at CERN," European Organisation For Nuclear Research, Jun. 26, 1996.
Kiencke, U., "CAN, A Ten Years' Anniversarial Review," CAN in Automation, Oct. 1996.
"CANopen Communication Profile for Industrial Systems," CAN in Automation, Oct. 30, 1996.
Dean, A. et al., "The Pitfalls of Embedded Communication Networks," Electronic Engineering Times—India, Sep. 1997.
Bartle, E., "All Together Now," IEE Review, Sep. 1998.
Buhler, C. et al., "Modular Architecture for Wheelchairs with Environment Integration Capabilities," IOS Press, 1999.
"CANopen Application Layer and Communication Profile," CAN in Automation, Jun. 16, 1999.
Beattie, P., "The Design and Implementation of a Focused Stochastic Diffusion Network to Solve the Self-Localisation Problem on an Autonomous Wheelchair," The University of Reading, Jul. 2000.
Zeltwanger, H., "State-of-the-Art CAN Applications and Future Requirements," CAN in Automation, Oct. 2000.
Schafmayer, A. et al., "The Process-Optimized Operating Room-Implementation of an Integrated OR System into Clinical Routine," Electromedica, 2002.
Strkyer, Stryker Epic II Model 2030/2031 Maintenance Manual, Rev. A, May 2000.
Stryker, Stryker Epic II Model 2030/2031 Maintenance Manual, Rev. _, Oct. 2000.
Stryker, Stryker Epic II Model 2030/2031 Operations Manual, Rev. F, Oct. 2000.
Stryker, "Stryker Go Bed Maintenance Manual," Dec. 2000.
Stryker, "Stryker Go Bed Operations Manual," Dec. 2000.
Stryker, "Stryker Epic II Model 2030-2031 Maintenance Manual, Rev. A," May 2001.
Stryker, "Stryker Epic II Model 2030/2031 Maintenance Manual, Rev. _," Sep. 2001.
Loy, D. et al., "Open Control Networks, LonWorks EIA/709 Technology," Kluwer Academic Publishers, 2001.

Noury, N. et al., "The Telemedicine Home Care Station: a Model and some Technical Hints," Healthcomm 2001.
Gruhler, G. et al., "Preparation Document for a CANopen Device Profile for Medical Components," Siemens AG, Erlagen Medical Solutions, Division CO, May 2002.
Corrigan, S., "Introduction to the Controller Area Network (CAN)," Texas Instruments, Aug. 2002.
Siemens, "CiA SiG Medical Devices,".
Gardner, R. et al., "Patient Monitoring Systems," Biomedical Informatics, Shortliffe, 2002.
Hill-Rom, 1993 Service Manual Advance 1000/2000, 1993.
Hill-Rom, 1994 Service Manual, Advance 2000, 1994.
Eushian Tran, "Multi-Bit Error Vulnerabilities in the Controller Area Network Protocol," Carnegie Mellon University, Pittsburgh, PA, May 1999.
Pazul, K., "Controller Area Network (CAN) Basics," Microchip Technology, Inc., 1999.
"Impression" Brochure, Kinetic Concepts, Inc., Aug. 1996.
Stryker Medical Go Bed Brochure, 2001.
Hill-Rom Med Surg Bed Accessories Brochure, 1998.
5th Anniversary CIA 1992-1997, CAN Application Spotlights, Controller Area Network (CAN) and CAN in Automotion (CIA).
Akrotech 4000 Brochure. 1992.
Analog Devices, Inc. LTC 2875 ±60V Fault Protected 3.3V or 5V 25kV ESD High Seed Can FD Transceiver Data Sheet, 2015-2019.
TJA1050 High Speed CAN Transceiver Product Specification, Oct. 22, 2003.
Skroppa, O., et al. "Common Mode Chokes in CAN Networks: Source of Unexpected Transients," Texas Instruments, Jan. 2008.
Kisling, D., et al. "How to Design Isolated CAN Systems with Correct Bus Protection," Texas Instruments, Jul. 2018.
Communication pursuant to Article 94(3) EPC issued by the European Patent Office on Dec. 17, 2025, for European Patent Application No. 24 191 698.0 (6 pages).
Extended European Search Report issued in European Patent Application No. 24191698.0; dated Jan. 15, 2025 (12 pages).
TJA1048; Dual high-speed CAN transceiver with Standby mode Product data sheet; Rev. Mar. 6-19, 2018, © NXP Semiconductors N.V. 2018 (27 pages).
NCV7446; Dual CAN FD Transceiver, High Speed, Low Power; Dec. 2019—Rev. 2; © Semiconductor Components Industries, LLC, 2018 (14 pages).
TLE6254V; High speed dual CAN transceiver with bus wake-up datasheet; Rev. 1.0 Oct. 16, 2019; © Infineon Technologies AG (39 pages).

* cited by examiner

CAN BUS INTERCONNECTION CIRCUIT

The present application claims the benefit, under 35 U.S.C. § 119(e), of U.S. Provisional Application No. 63/529, 795, filed Jul. 31, 2023, which is hereby incorporated by reference herein in its entirety.

BACKGROUND

The present disclosure relates to a CAN bus interconnection circuit and particularly, to a circuit for interconnecting two independent CAN systems which have termination resistors already defined. More particularly, the present disclosure relates to a circuit for interconnecting a CAN system of a patient bed with a CAN system of a mattress.

The specifications for a controller area network (CAN) are set forth in International Organization for Standardization (ISO) 11898 which, among other things, requires that a CAN bus have a nominal bus load of 60 Ohms ($\Omega$) and a maximum bus load of 120$\Omega$. To meet the CAN bus load requirements, many CAN busses are terminated at each end by a 120$\Omega$ resistor. Resistances in the various nodes of the CAN further reduce the overall bus resistance downwardly toward the nominal 60$\Omega$ resistance. If two CAN's that operate independently are electrically coupled together with simple CAN high (CAN_H) and CAN low (CAN_L) conductors, such as twisted pair wires for example, the bus loads of the two CAN's will potentially drop below the 60 $\Omega$ nominal load resulting in CAN communication failures. Particularly, if the two CAN's independently operate at the 60 $\Omega$ nominal load, interconnecting them with simple conductors will drop the bus load to 30$\Omega$. Thus, there is a need for a circuit that interconnects two otherwise independently operable CAN busses having termination resistors already defined, but without any resulting communication failures. Such a circuit may be used, for example, to interconnect a first device, such as a patient bed, with a second device, such as a mattress for the patient bed.

SUMMARY

An apparatus, system, or method may comprise one or more of the features recited in the appended claims and/or the following features which, alone or in any combination, may comprise patentable subject matter:

According to a first aspect of the present disclosure, a circuit for interconnecting a first controller area network (CAN) bus with a second CAN bus may be provided. The circuit may include a first CAN transceiver, a second CAN transceiver, and a pair of transistors and six resistors electrically interconnecting the first and second CAN transceivers.

In some embodiments of the first aspect, the pair of transistors may include a first positive-negative-positive (PNP) transistor and a second PNP transistor. If desired, a first base of the first PNP transistor may be coupled to a first transmit pin of the first CAN transceiver and a first receive pin of the second CAN transceiver. Alternatively or additionally, a second base of the second PNP transistor may be coupled to a second transmit pin of the second CAN transceiver and a second receive pin of the first CAN transceiver. Further alternatively or additionally, the first base of the first PNP transistor may be coupled to the first transmit pin of the first CAN transceiver via a first resistor of the six resistors and the first base of the first PNP transistor may be coupled to the receive pin of the second CAN transceiver via the first resistor and a second resistor of the six resistors. Optionally, the first resistor may have a resistance of about 21 kilo Ohm (k$\Omega$) and the second resistor may have a resistance of about 1 k$\Omega$.

If desired, a first collector of the first PNP transistor may be coupled to the second receive pin through a third resistor of the six resistors. For example, the third resistor may have a resistance of about 1 k$\Omega$. Alternatively or additionally, a first emitter of the first PNP transistor may be coupled to the first base of the first PNP transistor through a third resistor, different from the previously mentioned third resistor, of the six resistors. In such arrangements, this different third resistor may have a resistance of about 21 k$\Omega$. Optionally, the first emitter and the first base of the first PNP transistor may be coupled to a voltage source.

In some embodiments of the first aspect, the second base of the second PNP transistor may be coupled to the second transmit pin of the second CAN transceiver via a first resistor of the six resistors and the second base of the second PNP transistor may be coupled to the second receive pin of the first CAN transceiver via the first resistor and a second resistor of the six resistors. In some such embodiments, the first resistor may have a resistance of about 21 kilo Ohm (k$\Omega$) and the second resistor may have a resistance of about 1 k$\Omega$. Alternatively or additionally, a collector of the second PNP transistor may be coupled to the second receive pin through a third resistor of the six resistors. For example, the third resistor may have a resistance of about 1 k$\Omega$. Further alternatively or additionally, a second emitter of the second PNP transistor may be coupled to the first base of the first PNP transistor through a third resistor, different from the previously mentioned third resistor, of the six resistors. For example, this different third resistor may have a resistance of about 21 k$\Omega$. Optionally, the second emitter and the second base of the second PNP transistor may be coupled to a voltage source.

With regard to the circuit of the first aspect, the present disclosure contemplates that a transmit pin of the first CAN transceiver may be coupled to a base of the first PNP transistor and a receive pin of the first CAN transceiver may be coupled to a collector of the first PNP transistor. If desired, the first CAN transceiver of the first aspect may include a first high speed CAN transceiver and the second CAN transceiver of the first aspect may include a second high speed CAN transceiver.

According to a second aspect of the present disclosure, a circuit for interconnecting a first controller area network (CAN) bus with a second CAN bus may be provide. The circuit of the second aspect may include a first transmit/receive repeater, a second transmit/receive repeater, and a first PNP transistor that may have a first base coupled to a first electrical line that may extend between a first transmit pin of the first transmit/receive repeater and a first receive pin of the second transmit/receive repeater. The first PNP transistor of the second aspect further may have a first collector that may be coupled to a second electrical line that may extend between a second receive pin of the first transmit/receive repeater and a second transmit pin of the second transmit receive repeater. The circuit of the second aspect also may include a second PNP transistor that may have a second base that may be coupled to the second electrical line and a second collector that may be coupled to the first electrical line.

In some embodiments of the second aspect, the first transmit/receive repeater may include a first high speed CAN transceiver and the second transmit/receive repeater may include a second high speed CAN transceiver. Optionally, the first base of the second aspect may be coupled to the first electrical line through a first resistor. Alternatively or additionally, the second receive pin may be coupled to the first collector via a second resistor that may be included in the second electrical line. Further alternatively or additionally, the first base may be coupled to a voltage source through a third resistor. For example, the first resistor may have a resistance of about 1 kilo Ohm (kΩ) and the second and third resistors each may have a resistance of about 21 kΩ. If desired, a first emitter of the first PNP transistor of the second aspect may be coupled to the voltage source.

Optionally, the second base of the second aspect may be coupled to the second electrical line through a first resistor. In such arrangements, the first receive pin may be coupled to the second collector via a second resistor that may be included in the first electrical line. Alternatively or additionally, the second base may be coupled to a voltage source through a third resistor. For example, the first resistor may have a resistance of about 1 kΩ and the second and third resistors each may have a resistance of about 21 kΩ. Furthermore, a first emitter of the second PNP transistor of the second aspect may be coupled to the voltage source.

In some embodiments of the second aspect, the first transmit/receive repeater may be electrically coupled to the first CAN bus in parallel with a termination resistor of the first CAN bus and the second transmit/receive repeater may be electrically coupled to the second CAN bus in parallel with a termination resistor of the second CAN bus. It is contemplated by the present disclosure that the circuit of the second aspect may be devoid of any diodes coupled to the first and second PNP transistors. It is further contemplated by the present disclosure that the circuit of the second aspect may be devoid of any diodes coupled to the first and second electrical lines that extend between the first and second transmit/receive repeaters.

According to a third aspect of the present disclosure, a circuit for interconnecting a first controller area network (CAN) bus with a second CAN bus may be provided. The circuit of the third aspect may include a first CAN transceiver, a second CAN transceiver, and a plurality of electrical components that may be coupled to a voltage source and that may interconnect a first transmit pin and a first receive pin of the first CAN transceiver with a second receive pin and a second transmit pin, respectively, of the second CAN transceiver. The plurality of electrical components may consist of a pair of transistors and six resistors.

In some embodiments of the third aspect, the pair of transistors may consist of a first PNP transistor and a second PNP transistor. Optionally, a first base of the first PNP transistor may be coupled to the first transmit pin of the first CAN transceiver and the second receive pin of the second CAN transceiver. Further optionally, a second base of the second PNP transistor may be coupled to the second transmit pin of the second CAN transceiver and the first receive pin of the first CAN transceiver. If desired, the first base of the first PNP transistor may be coupled to the first transmit pin of the first CAN transceiver via a first resistor of the six resistors and the first base of the first PNP transistor may be coupled to the second receive pin of the second CAN transceiver via the first resistor and a second resistor of the six resistors. For example, the first resistor may have a resistance of about 21 kilo Ohm (kΩ) and the second resistor may have a resistance of about 1 kΩ.

The present disclosure contemplates that, with regard to the third aspect, a first collector of the first PNP transistor may be coupled to the first receive pin through a third resistor of the six resistors. The third resistor may consist of a 1 kΩ resistor, for example. Optionally, a first emitter of the first PNP transistor of the third aspect may be coupled to the first base of the first PNP transistor through a third resistor of the six resistors. In such arrangements, the third resistor may have a resistance of about 21 kΩ. If desired, the first emitter and the first base of the first PNP transistor of the third aspect may be coupled to the voltage source. Optionally, the second base of the second PNP transistor may be coupled to the second transmit pin of the second CAN transceiver via a first resistor of the six resistors and the second base of the second PNP transistor may be coupled to the first receive pin of the first CAN transceiver via the first resistor and a second resistor of the six resistors. For example, the first resistor may have a resistance of about 21 kilo Ohm (kΩ) and the second resistor may have a resistance of about 1 kΩ.

In some embodiments of the third aspect, a collector of the second PNP transistor may be coupled to the second receive pin through a third resistor of the six resistors. The third resistor may have a resistance of about 1 kΩ, for example. Alternatively or additionally, a second emitter of the second PNP transistor of the third aspect may be coupled to the second base of the second PNP transistor through a third resistor of the six resistors. For example, the third resistor in such arrangements may have a resistance of about 21 kΩ. Further alternatively or additionally, the second emitter and the second base of the second PNP transistor may be coupled to the voltage source.

If desired, the first transmit pin of the first CAN transceiver of the third aspect may be coupled to a base of the first PNP transistor and the first receive pin of the first CAN transceiver of the third aspect may be coupled to a collector of the first PNP transistor. Also with regard to the third aspect, the first CAN transceiver may consist of a first high speed CAN transceiver and the second CAN transceiver may consist of a second high speed CAN transceiver.

According to a fourth aspect of the present disclosure, an occupant support system may include a bed that may be configured to support an occupant. The bed may have first circuitry that may include a first controller area network (CAN) that, in turn, may include a first CAN bus. The occupant support system further may include a mattress that may be configured for placement upon the bed. The occupant may lie on the mattress when being supported by the bed. The mattress may have second circuitry that, in turn, may include a second CAN having a second CAN bus. The occupant support system also may include an interconnection circuit that may be configured to interconnect the first and second CAN busses. The interconnection circuit may include a first CAN transceiver, a second CAN transceiver, and a pair of transistors and six resistors that may electrically interconnect the first and second CAN transceivers.

In some embodiments of the fourth aspect, the pair of transistors may include a first PNP transistor and a second PNP transistor. Optionally, a first base of the first PNP transistor of the fourth aspect may be coupled to a first transmit pin of the first CAN transceiver and a first receive pin of the second CAN transceiver. Further optionally, a second base of the second PNP transistor of the fourth aspect may be coupled to a second transmit pin of the second CAN transceiver and a second receive pin of the first CAN transceiver. The present disclosure further contemplates that the first base of the first PNP transistor of the fourth aspect may be coupled to the first transmit pin of the first CAN transceiver via a first resistor of the six resistors and the first base of the first PNP transistor may be coupled to the receive pin of the second CAN transceiver of the fourth aspect via the first resistor and a second resistor of the six resistors. For example, the first resistor may have a resistance of about 21 kilo Ohm (kΩ) and the second resistor may have a resistance of about 1 kΩ.

If desired, a first collector of the first PNP transistor of the fourth aspect may be coupled to the second receive pin through a third resistor of the six resistors. In such arrangements, the third resistor may have a resistance of about 1 kΩ. Also if desired, a first emitter of the first PNP transistor of the fourth aspect may be coupled to the first base of the first PNP transistor through a third resistor of the six resistors. For example, the third resistor may have a resistance of about 21 kΩ. Alternatively or additionally, the first emitter and the first base of the first PNP transistor of the fourth aspect may be coupled to a voltage source.

In some embodiments of the fourth aspect, the second base of the second PNP transistor may be coupled to the second transmit pin of the second CAN transceiver via a first resistor of the six resistors and the second base of the second PNP transistor may be coupled to the second receive pin of the first CAN transceiver via the first resistor and a second resistor of the six resistors. For example, the first resistor may have a resistance of about 21 kilo Ohm (kΩ) and the second resistor may have a resistance of about 1 kΩ. If desired, a collector of the second PNP transistor of the fourth aspect may be coupled to the second receive pin through a third resistor of the six resistors. The third resistor may have a resistance of about 1 kΩ, for example.

Optionally, a second emitter of the second PNP transistor of the fourth aspect may be coupled to the first base of the first PNP transistor through a third resistor of the six resistors. In such arrangements, the third resistor may have a resistance of about 21 kΩ. Further optionally, the second emitter and the second base of the second PNP transistor of the fourth aspect may be coupled to a voltage source. Alternatively or additionally, a transmit pin of the first CAN transceiver of the fourth aspect may be coupled to a base of the first PNP transistor and a receive pin of the first CAN transceiver may be coupled to a collector of the first PNP transistor.

In some embodiments of the fourth aspect, the first CAN transceiver may include a first high speed CAN transceiver and the second CAN transceiver may include a second high speed CAN transceiver. In some embodiments of the occupant support system of the fourth aspect, the first CAN transceiver, the second CAN transceiver, the pair of transistors, and the six resistors may be situated within an interior region of the mattress. The present disclosure further contemplates that the interconnection circuit of the fourth aspect may be devoid of any diodes. The same goes for the circuits of the first, second, and third aspects.

Additional features, which alone or in combination with any other feature(s), such as those listed above, may comprise patentable subject matter and will become apparent to those skilled in the art upon consideration of the following detailed description of various embodiments exemplifying the best mode of carrying out the embodiments as presently perceived.

BRIEF DESCRIPTION OF THE DRAWINGS

The detailed description particularly refers to the accompanying figures, in which.

DETAILED DESCRIPTION

Figure 1A:
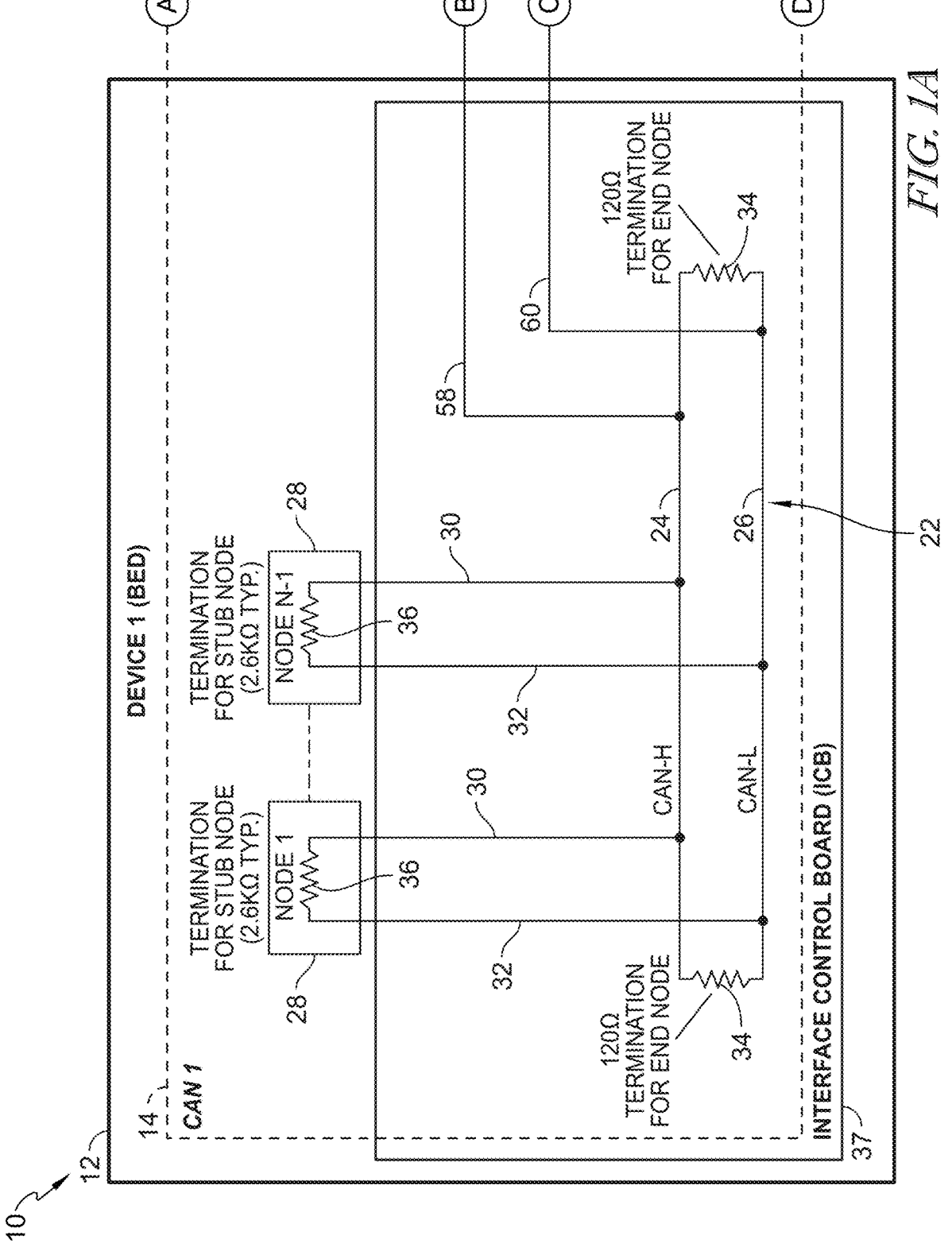
FIG. 1A and FIG. 1B together form a block diagram showing a first device, such as a bed, having a first controller area network (CAN) and a second device, such as a mattress, having a second CAN, the second device having a main control board (MCB) with a CAN interconnection circuit to interconnect the first and second CAN's.
Figure 1B:
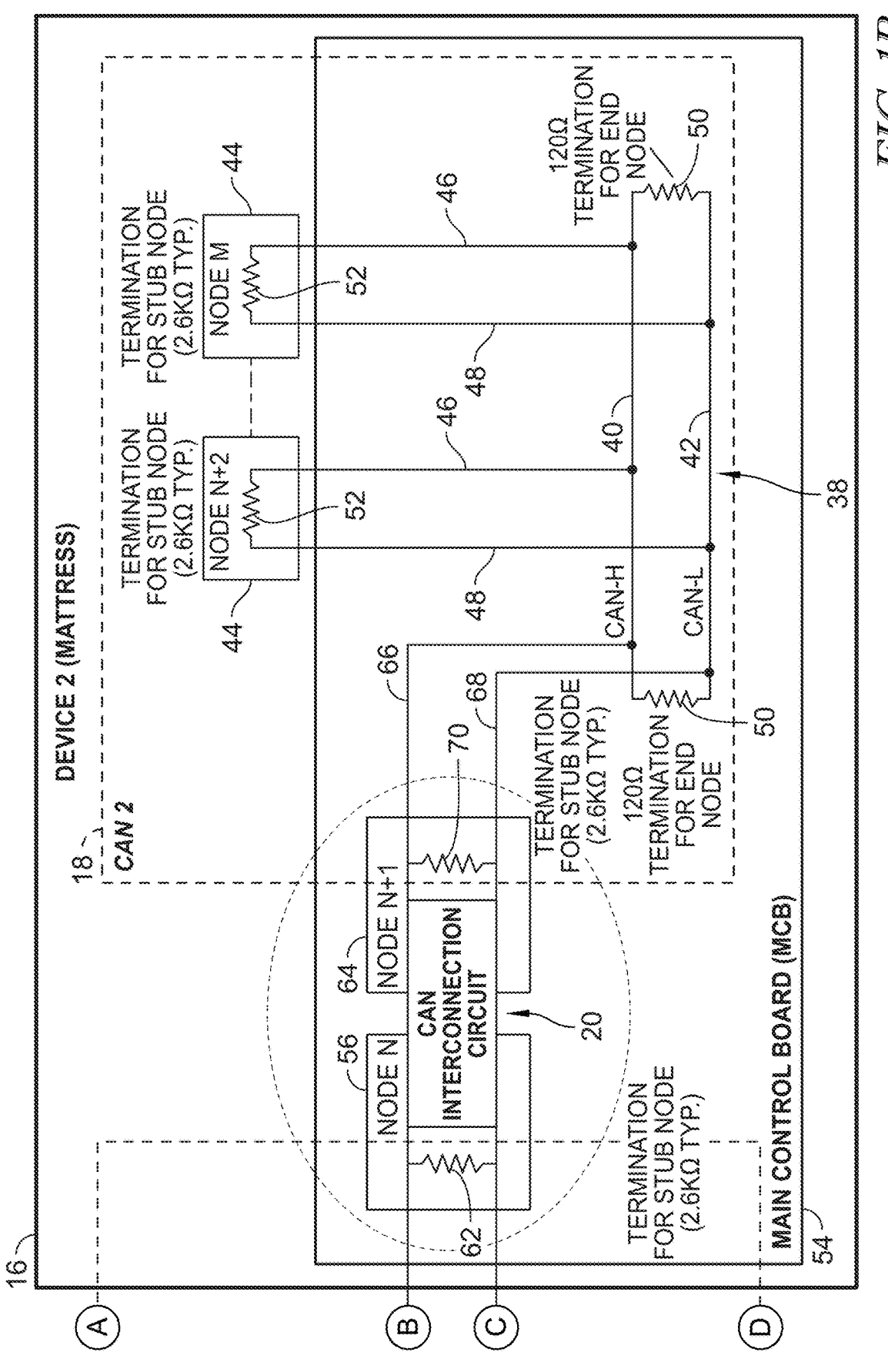

A system 10 according to the present disclosure includes a first device 12 having a first controller area network 14 and a second device 16 having a second CAN 18 as shown in FIGS. 1A and 1B. A CAN interconnection circuit 20, shown in FIG. 1B, is provided in system 10 to electrically interconnect CAN's 14, 18 together in a manner that does not result in communication failures that otherwise might occur if the bus load of either or both of CAN's 14, 18 drops below a nominal value of 60Ω as set forth in ISO 11898. Because ISO standards may be revised or updated from time to time, when ISO 11898 is referred to herein, it is referring to the standard in effect as of the filing date of the present application. Details of CAN interconnection circuit 20 are provided below in connection with FIGS. 2B and 3B.

CAN interconnection circuit 20 may be used to interconnect CAN's, such as CAN's 14, 18, of any two or more devices according to the present disclosure. However, for discussion purposes herein, the first device 12 comprises a bed and the second device 16 comprises a mattress that is supported by the bed. More particularly, the present disclosure contemplates that, in some embodiments, bed 12 is a patient bed of the type found in a healthcare facility and mattress 16 is an air mattress of the type having a pneumatic system with an air source (e.g., pump, compressor, and/or blower) and inflation/deflation control components such as valves, manifolds, conduits, pressure sensors, etc. that are operated to inflate and deflate various air bladders or cells included in the mattress 16. Bed 14, therefore, is of the type having movable mattress support sections supported on an upper frame which, in turn, is raiseable, lowerable, and tiltable relative to a base frame via operation of various actuators, such as electrically controlled linear actuators. Thus, the contemplated bed 12 is basically a bed frame that is movable into a variety of configurations to support a patient in a variety of positions. Of course, the patient lies on the mattress 16 which, in turn, is supported by the mattress support sections of bed 12. In some embodiments, bed 12 is the Accella™ Smart Bed manufactured by Hill-Rom S.A.S. of Pluvigner, France.

Still referring to FIGS. 1A and 1B, first CAN 14 includes a CAN bus 22 having a CAN high (CAN-H) line 24 and a CAN low (CAN-L) line 26. CAN 14 also includes a number of CAN nodes 28 that each couple to lines 24, 26 via respective CAN-H and CAN-L conductors 30, 32. In FIG. 1A, CAN 14 is depicted with two CAN nodes 28 with one node 28 being labeled as "NODE 1" and another node 28 being labeled as "NODE N−1." However, it should be appreciated that CAN 14 includes more than two nodes 28 in some embodiments, or just a single node 28, in other embodiments, depending upon the design of bed 12. Bus 22 terminates at each end with a 120Ω resistor 34. That is, each of the terminal ends of lines 24, 26 are coupled together through a respective resistor 34. Each node 28 typically has a stub resistance of about 2.3 kΩ as indicated by resistors 36. In the illustrative example of FIG. 1A, CAN bus 22 is included on an interface control board (ICB) 37 of bed 12. It should be appreciated that ICB 37 includes other circuit components used for other functions of bed 12.

Similar to first CAN 14, second CAN 18 of system 10 includes a CAN bus 38 having a CAN high (CAN-H) line 40 and a CAN low (CAN-L) line 42. CAN 18 also includes a number of CAN nodes 44 that each couple to lines 40, 42 via respective CAN-H and CAN-L conductors 46, 48. In FIG. 1B, CAN 18 is depicted with two CAN nodes 44 with one node 44 being labeled as "NODE N+2" and another node 44 being labeled as "NODE M." However, it should be appreciated that CAN 18 includes more than two nodes 44 in some embodiments, or just a single node 44, in other embodiments, depending upon the design of mattress 16. Similar to bus 22, bus 38 terminates at each end with a 120Ω resistor 50. That is, each of the terminal ends of lines 40, 42 are coupled together through a respective resistor 50. Similar to nodes 28 of CAN 14, each of nodes 44 of CAN 18 typically has a stub resistance of about 2.3 kΩ as indicated by resistors 52. In the illustrative example of FIG. 1B, CAN bus 38 is included on a main control board (MCB) 54 of mattress 16. It should be appreciated that MCB 54 includes other circuit components used for other functions of mattress 16.

As shown in FIG. 1B, CAN interconnection circuit 20 is included on MCB 54 of mattress 16. This is because mattress 16 is intended for use with legacy or existing beds 12 that are already in use in healthcare facilities with existing mattresses. Thus, mattress 16 is a replacement mattress for use on beds 12 in lieu of older models of mattresses. In the illustrative embodiment, CAN interconnection circuit 20 includes a first CAN node 56, labeled as "NODE N," that is electrically coupled to lines 24, 26 of bus 22 by respective CAN-H and CAN-L conductors 58, 60. Thus, CAN node 56 is shared by first CAN 14 and CAN interconnection circuit 20. Similar to nodes 28, 44, CAN node 56 has a typical stub resistance of about 2.3 kΩ as indicated by resistor 62. Also in the illustrative embodiment, CAN interconnection circuit 20 includes a second CAN node 64, labeled as "NODE N+1," that is electrically coupled to lines 40, 42 of bus 38 by respective CAN-H and CAN-L conductors 66, 68. Thus, CAN node 64 is shared by second CAN 18 and CAN interconnection circuit 20. Similar to nodes 28, 44, 56, CAN node 64 has a typical stub resistance of about 2.3 kΩ as indicated by resistor 70.

In the illustrative embodiment, MCB 54 is situated within the interior region of mattress 16, such as being housed within a pneumatic control box provided in a foot section of mattress 16. In other embodiments, CAN interconnection circuit 20, along with associated nodes 56, 64, is included on ICB 37 of bed 12 instead of on MCB 54 of mattress 16. In still other embodiments, some components of CAN interconnection circuit are included on ICB 37 of bed 12 while other components of CAN interconnection circuit are included on MCB 54 of mattress 16. In further variant embodiments, CAN interconnection circuit 20 is included in a housing that is separate from bed 12 and mattress 16, such as a separate pneumatic control box that hangs on a footboard of bed 12, for example. Thus, it should be appreciated that the location of components of CAN interconnection circuit 20 relative to first and second devices 12, 16 is at the discretion of the system designer, as long as the electrical connections between CAN interconnection circuit 20 and CAN's 14, 18 are maintained as described herein.

Figure 2A:
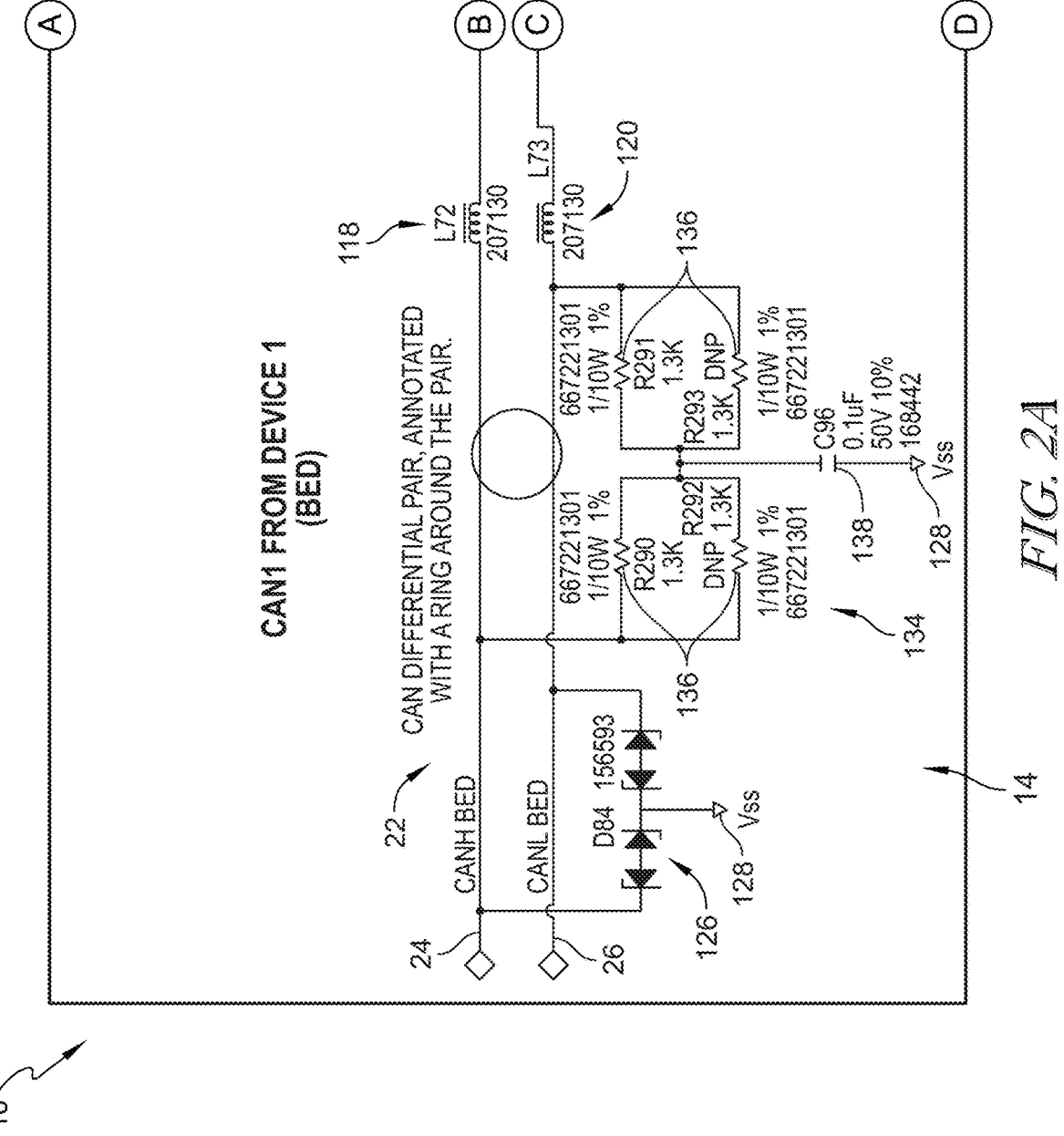
FIG. 2A, FIG. 2B, and FIG. 2C together form an electrical circuit schematic of the first and second CAN's and the CAN interconnection circuit of FIGS. 1A and 1B, the CAN interconnection circuit having first and second CAN transceivers, first and second PNP transistors, and six resistors.
Figure 2B:
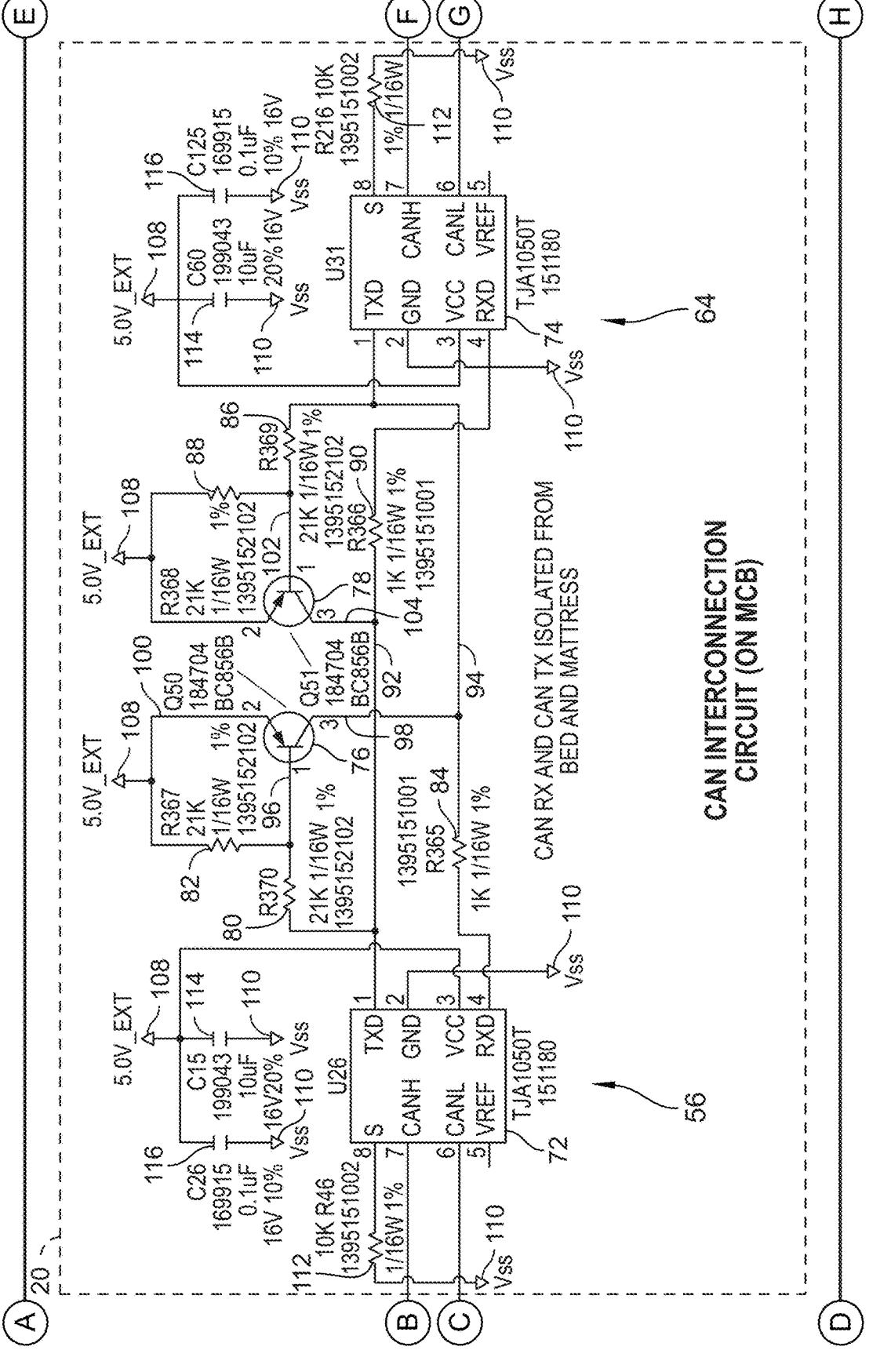

Referring now to FIG. 2B, CAN interconnection circuit 20 includes a first CAN transceiver 72 and a second CAN transceiver 74. Circuit 20 also includes a first transistor 76 and a second transistor 78 along with six resistors 80, 82, 84, 86, 88, 90. Resistor 90 is included in an electrical line 92 that extends from a transmit (TXD) pin of transceiver 72 to a receive (RXD) pin of transistor 74. Similarly, resistor 84 is included in an electrical line 94 that extends from a transmit (TXD) pin of transistor 74 to a receive (RXD) pin of transistor 72. In the illustrative embodiment, resistors 84, 90 each have resistances of about 1 kΩ.

In the present disclosure, including in the claims, any of resistors 80, 82, 84, 86, 88, 90 may be referred to as the "first" resistor, the "second" resistor, the "third" resistor, and so on. That is, the use of the terms first, second, third, fourth, etc. are used simply to indicate the order of introduction of a component in any given statement or claim, thereby to distinguish one component from another, and not to indicate any hierarchy of importance or occurrence in time or space. For example, in some instances one of resistors 80, 82, 84, 86, 88, 90 may be considered the first resistor and in other instances, another of resistors 80, 82, 84, 86, 88, 90 may be considered the first resistor. Furthermore, any of resistors 80, 82, 84, 86, 88, 90 may comprise two or more resistors in series and yet still be considered a single resistor. Similarly, any of resistors 80, 82, 84, 86, 88, 90 may comprises two or more resistors in parallel yet still be considered a single resistor. Moreover, any of resistors 80, 82, 84, 86, 88, 90 may include combinations of series and parallel resistors yet still may be considered a single resistor.

In the illustrative embodiment, transistors 76, 78 are PNP transistors. Thus, transistor 76 has a base 96, a collector 98, and an emitter 100. Similarly, transistor 78 has a base 102, a collector 104, and an emitter 106. Collector 98 of transistor 76 is coupled directly to line 94 and collector 104 of transistor 78 is coupled directly to line 92. In the depicted circuit 20, collector 98 is coupled to RXD pin of transceiver 72 through resistor 84 and collector 104 of transistor 78 is coupled to RXD pin of transceiver 74 through resistor 90. Base 96 of transistor 76 is coupled to line 92 through resistor 80 and base 102 of transistor 78 is coupled to line 94 through resistor 86. Furthermore, base 96 of transistor 76 is coupled to emitter 100 thereof through resistor 82 and base 102 of transistor 78 is coupled to emitter 106 thereof through resistor 88. Emitters 100, 106 of respective transistors 76, 78 are also coupled to a 5.0 Volt power source 108. Bases 96, 102 of transistors 76, 78 are also coupled to the 5.0 Volt power source 108 through respective resistors 82, 88.

As is apparent in FIG. 2B, CAN interconnection circuit 20 is devoid of any diodes. That is, there aren't any diodes in circuit 20 that are coupled to the first and second PNP transistors 76, 78. Furthermore, there aren't any any diodes in circuit 20 that are coupled to the first and second electrical lines 92, 94 that extend between the first and second transmit/receive repeaters 72, 74. Finally, in circuit 20, there aren't any diodes coupled to any of resistors 80, 82, 84, 86, 88, 90.

Still referring to FIG. 2B, ground (GND) pins of transceivers 72, 74 are each coupled to ground 110 (labeled as Vss). Select(S) pins of transceivers 72, 74 are also each coupled to ground 110 through respective resistors 112 that each have resistances of about 10 kΩ. Supply voltage pins (labeled Vcc) of transceivers 72, 74 are each coupled to the 5.0 Volt power source and to ground 110 through a parallel combination of respective 10 micro Farad (μF) capacitors 114 and respective 0.1 μF capacitors 116. Reference voltage (VREF) pins of transceivers 72, 74 are open. CANH and CANL pins of transceiver 72 are coupled to lines 24, 26, respectively, of bus 22 via respective first and second magnetic core inductors 118, 120 which serve as a common-mode choke for the termination node 56 of the first CAN 14 to filter electromagnetic interference in lines 24, 26 of bus 22. Similarly, CANH and CANL pins of transceiver 74 are coupled to lines 40, 42, respectively, of bus 38 via respective first and second magnetic core inductors 122, 124 which serve as a common-mode choke for the termination node 64 of the second CAN 18 to filter electromagnetic interference in lines 40, 42 of bus 22.

CAN 14 includes a bidirectional transient-voltage suppression (TVS) diode device 126 that interconnects lines 24, 26 of bus 22 and that is coupled to ground 128 (labeled as Vss) of the first CAN 14. Similarly, CAN 18 includes a bidirectional TVS diode device 130 that interconnects lines 40, 42 of bus 38 and that is coupled to ground 132 (also labeled as Vss) of the second CAN 18. Bidirectional TVS diode devices 126, 130 protect the respective CAN's 14, 18 from electrostatic discharges or voltage surges occurring in respective busses 22, 38. Bidirectional TVS diode devices 126, 130 are available as single integrated circuit chips from a number of manufacturers. CAN 14 further includes a low-pass filter 134 in the form of a split termination circuit that interconnects lines 24, 26 of bus 22. Low-pass filter 134 includes a pair of parallel 1.3 kΩ resistors 136 (i.e., four total 1.3 kΩ resistors 136) with a common junction of the four resistors 136 being coupled to ground 128 through a 0.1 μF capacitor 138. Similarly, CAN 18 further includes a low-pass filter 140 in the form of a split termination circuit that interconnects lines 40, 42 of bus 38. Low-pass filter 140 includes a pair of parallel 1.3 kΩ resistors 142 (i.e., four total 1.3 kΩ resistors 142) with a common junction of the four resistors 142 being coupled to ground 132 through a 0.1 μF capacitor 144.

Figure 2C:
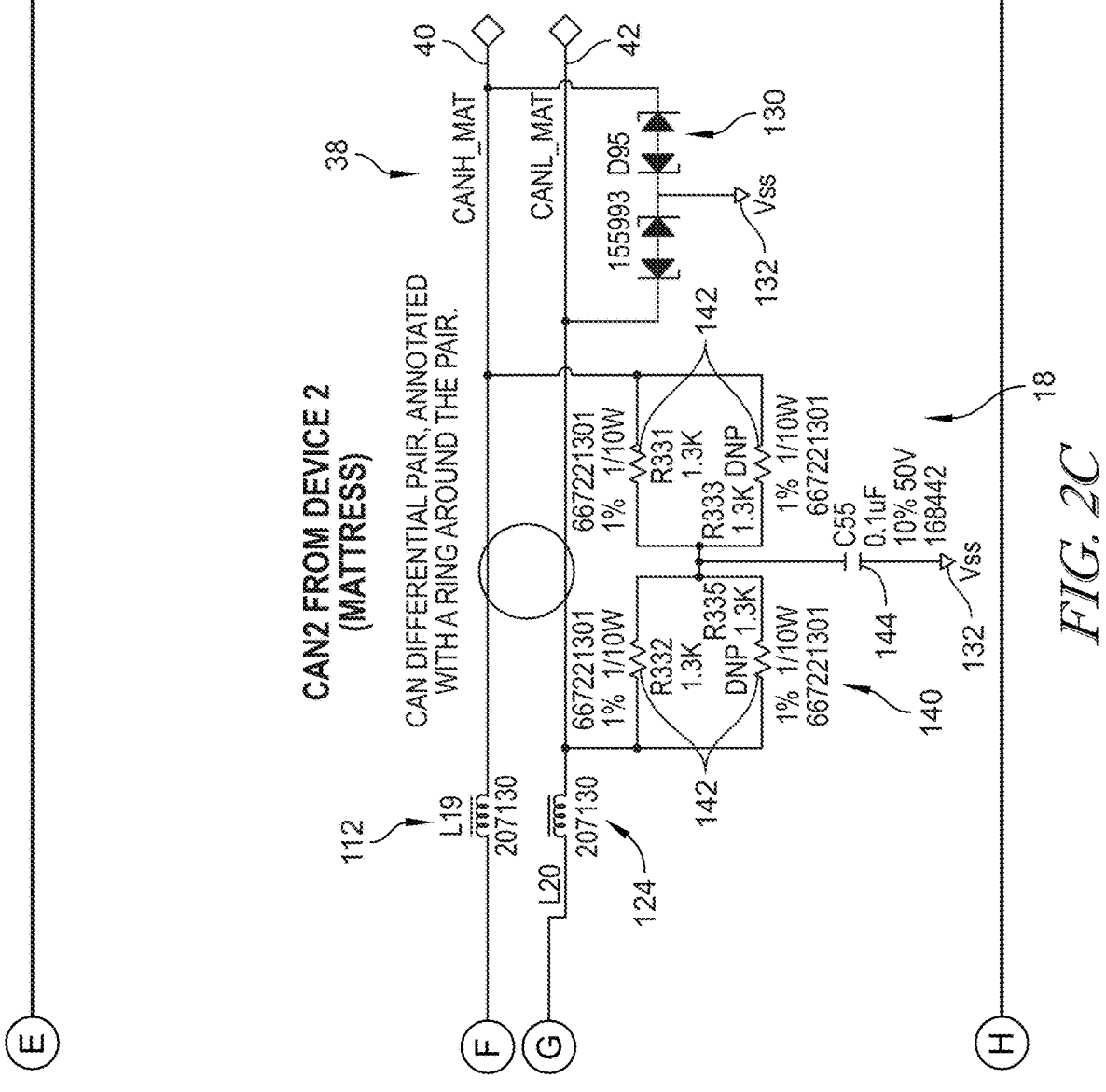

In the illustrative embodiment of FIGS. 2A, 2B, and 2C, transceivers 72, 74 are each high speed CAN transceivers. According to the present disclosure, a high speed CAN transceiver is considered to be one that transmits data at a rate of more than 128 kilobits per second (kbps), up to 1 Megabits per second (Mbps) (aka 1 Megabaud (Mbaud)), whereas a low speed CAN transceiver is one that transmits data at a rate up to 128 kbps. In the embodiment of system 10 in which bed 12 is the Accella™ Smart Bed manufactured by Hill-Rom S.A.S. of Pluvigner, France, along with mattress 16, the transceivers of nodes 28, 44, 56, 64, including transceivers 72, 74, operate at 500 kbps.

A suitable high speed CAN transceiver for use in CAN interconnection circuit 20 as each of transceivers 72, 74 is the model number TJA1050T/CM, 118 high speed CAN transceiver available from NXP Semiconductors of Eindhoven, Netherlands. Other suitable high speed transceivers for possible use in circuit 20 as either or both of transceivers 72, 74 are the model number LTC2875 high speed CAN transceiver available from Analog Devices Inc. of Wilmington, Massachusetts, U.S.A and model numbers MCP2551-E/SN or MCP2561-E/SN high speed CAN transceivers available from Microchip Technology, Inc. of Chandler, Arizona, U.S.A. Also in the illustrative embodiment, suitable PNP transistors 76, 78 are model number BC856B transistors available from Nexperia of Nijmegen, Netherlands but other PNP transistors from other manufacturers are also suitable for use in circuit 20.

According to the present disclosure, CAN's 14, 18 are each configured to operate independently without being interconnected by circuit 20. However, circuit 20 is configured to interconnect CAN's 14, 18 together such that a combined CAN is able to operate without any communication failures. The combined CAN includes the combination of nodes 28 of the first CAN 14, nodes 44 of the second CAN 18, and shared nodes 56, 64 included in CAN interconnection circuit 20. With reference to FIGS. 1A and 1B, the combined CAN includes nodes labeled NODE 1 through NODE M, including the nodes labeled NODE N−1, NODE N, NODE N+1, and NODE N+2. Of course, FIGS. 1A and 1B are diagrammatic in nature and the combined CAN of CAN's 14, 18, including circuit 20, may include many more nodes 28, 44 than those depicted in a real world implementation.

In one embodiment in which CAN's 14, 18 of respective bed 12 and mattress 16 are able to operate independently or are able to be connected together via circuit 20, bed 12 includes seven CAN nodes 28 and mattress 16 includes four CAN nodes 44. Thus, when connected together and accounting for nodes 56, 64 of circuit 20, there are thirteen CAN nodes in total in system 10. The seven CAN nodes 28 of bed 12 in this embodiment include the following: (1) an interface control board (ICB) node (e.g., main control board of the bed with a microcontroller) terminated with 120 (resistors 34; (2) a wireless interface board (WIB) node (e.g., a wireless interface with a system-on-module (SOM) for a wireless connectivity feature); (3) a first human interface board (HIB1) node (e.g., for a graphical user interface (GUI) display control on a left side of bed 12); (4) a second Human Interface Board (HIB2) node (e.g., for a graphical user interface (GUI) display control on a right side of bed 12); (5) a scale control board (SCB) node (e.g., control board for a weigh scale system of bed 12); (6) a mattress node (e.g., a node to communicate with mattress 16, when connected); and (7) a programming node (e.g., a node used for diagnostics and programming of bed 12) terminated with 120Ω resistors. The four CAN nodes 44 of mattress 16 in this embodiment include the following: (1) an MCB node (e.g., main control board of the mattress with microcontroller) terminated with 120Ω resistors 50; (2) SOM node (e.g., SOM module for wired and wireless connectivity); (3) a bed node (e.g., a node to communicate with bed 12 and included in CAN interconnection circuit 20); and (4) a programming node (e.g., a node used for diagnostics and programming of mattress 16) terminated with 120Ω resistors.

Transceivers 72, 74 are sometimes referred to as transmit/receive repeaters herein because, in the dominant mode, they transmit signals via the respective TXD pins that correspond to the differential signals (high=logic 1, or low=logic 0) received at the respective CANH, CANL pins, for receipt by the RXD pin of the other of transceivers 72, 74 that is in the recessive state. The transistors 76, 78 prevent both transceivers 72, 74 from being able to operate in the dominant state simultaneously, regardless of the dominant states of either or both of busses 22, 38. For example, if both CAN busses 22, 38 are in the recessive state, the RXD and TXD pins of both transmit/received repeaters 72, 74 are high such that both transceivers 72, 74 are in a passive state, and both transistors 76, 78 are off. If bus 22 enters into the dominant state, RXD pin of transceiver 72 goes low which turns on transistor 78 which, in turn, disables transceiver 72 from becoming dominant, no matter what. When RXD pin of transceiver 72 goes low, this also forces transceiver 74 and bus 38 into the dominant state which means that circuit 20 has operated to pass the dominant state from bus 22 of CAN 14 to bus 38 of CAN 18 (e.g., from left to right in FIGS. 2A, 2B, and 2C).

On the other hand, if bus 38 enters into the dominant state, RXD pin of transceiver 74 goes low which turns on transistor 76 which, in turn, disables transceiver 74 from becoming dominant, no matter what. When RXD pin of transceiver 74 goes low, this also forces transceiver 72 and bus 22 into the dominant state which means that circuit 20 has operated to pass the dominant state from bus 38 of CAN 18 to bus 22 of CAN 14 (e.g., from right to left in FIGS. 2A, 2B, and 2C). If both CAN busses 22, 38 are in the dominant state, both transistors 76, 78 of circuit 20 are turned on such that neither of transceivers 72, 74 is able to force a dominant state.

Figure 3A:
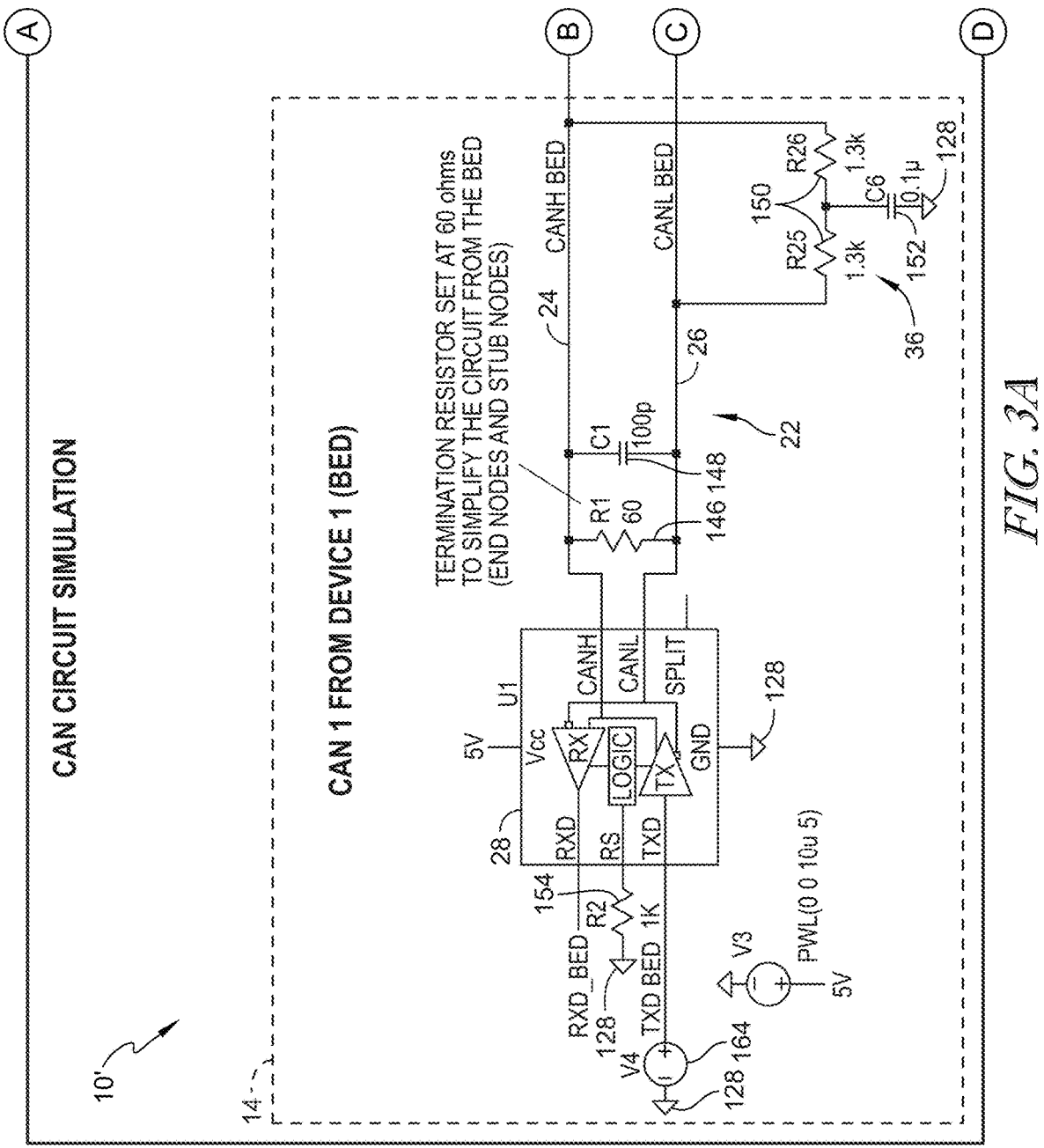
FIG. 3A, FIG. 3B, and FIG. 3C together form an electrical circuit schematic of a simulation circuit showing a model of the first and second CAN's and the CAN interconnection circuit with a termination resistor of the first CAN establishing a bus load at a nominal 60Ω value.
Figure 3B:
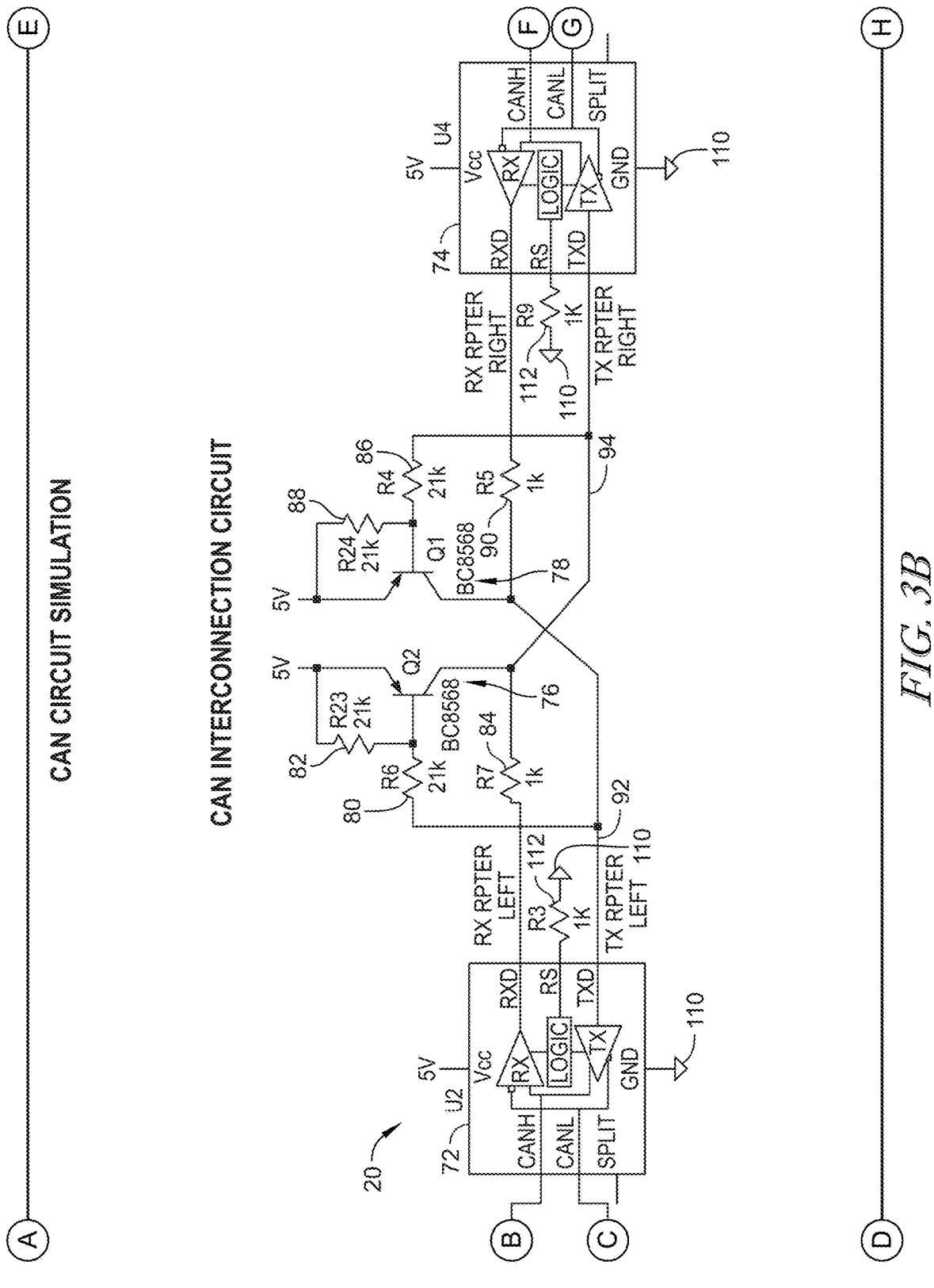
Figure 3C:
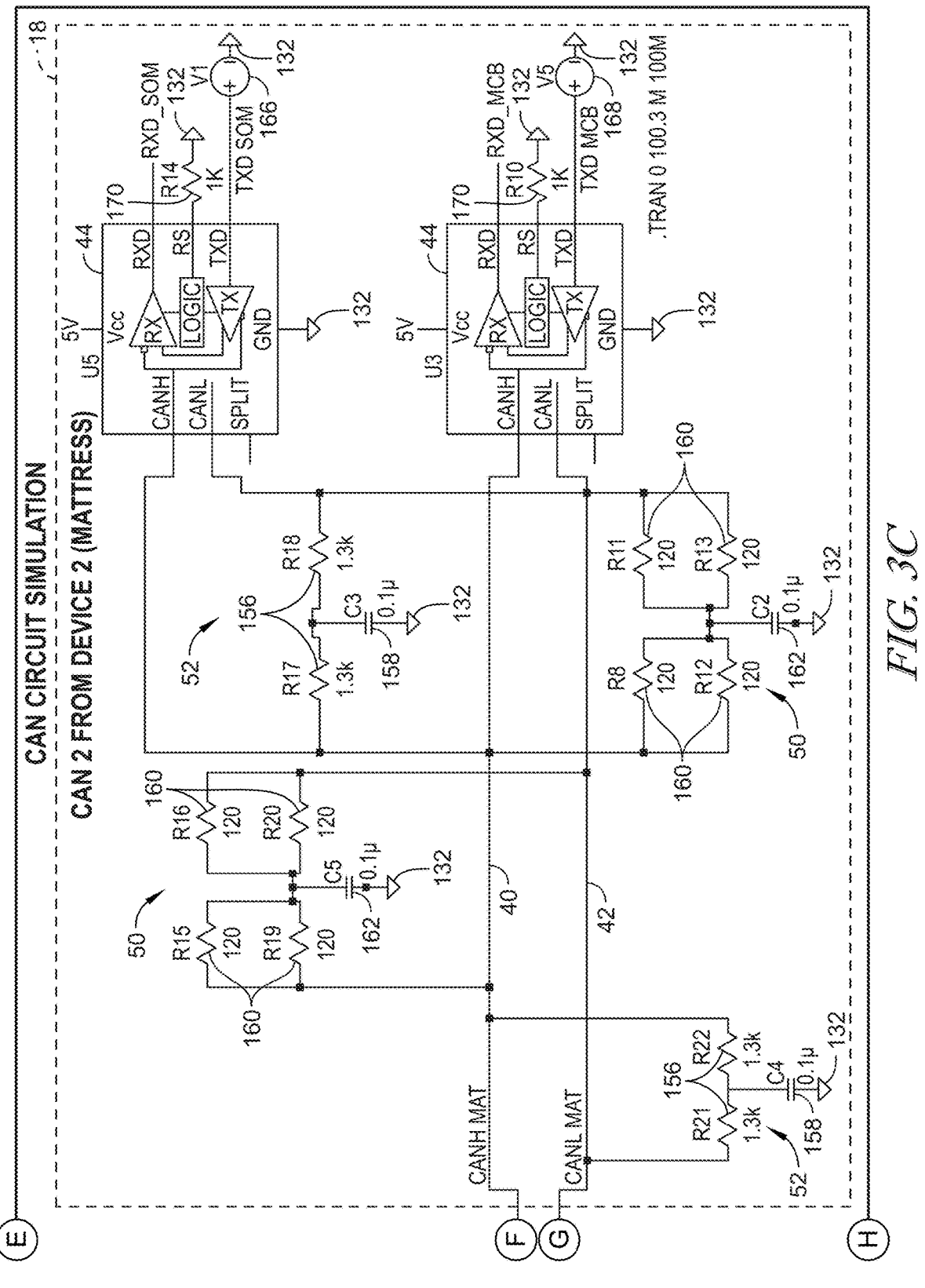

Referring now to FIGS. 3A, 3B, and 3C, a CAN circuit simulation of system 10' is shown and is a model of system 10 shown in FIGS. 1A and 1B and in FIGS. 2A, 2B, and 2C. Thus, the same reference numbers used in FIGS. 1A, 1B, 2A, 2B, and 2C for various components of system 10 are also used in FIGS. 3A, 3B, and 3C for like components of simulation system 10', where appropriate, even though simulation system 10' is simply a computer model of system 10 with some slight differences. Simulation system 10' was created using LTSPICE® software available from Analog Devices Inc. of Wilmington, Massachusetts, U.S.A. One difference between simulation system 10' and system 10 of FIGS. 1A, 1B, 2A, 2B, and 2C is that the FIG. 3A, 3B, 3C CAN circuit simulation system 10' was modeled with a termination resistor 146 for CAN 14 set right at the nominal 60Ω limit of the ISO 11898 standard. This was done in order to confirm that CAN interconnection circuit 20 would operate for its intended purpose at the nominal ISO 11898 standard limit without having to actually construct a real world system 10 at the nominal limit.

CAN transceivers 28, 44, 72, 74 in simulation system 10' are modeled as model number LTC2875 high speed CAN transceivers available from Analog Devices, Inc. but these operate in substantially the same manner as the model no. TJA1050T high speed transceivers 72, 74 of FIG. 2B with some slight differences in pin labeling nomenclature. For example, the VREF pins of the transceivers 72, 74 in FIG. 2B are labeled as SPLIT pins in the transceivers 28, 44, 72, 74 of FIGS. 3A, 3B, and 3C. Also, the select(S) pins of the transceivers 72, 74 in FIG. 2B are labeled as RS pins in the transceivers 72, 74 of FIG. 3B.

First CAN 14 of system 10' includes a 100 pF capacitor 148 interconnecting CANH line 24 and CANL line 26 in parallel with termination resistor 146. Furthermore, stub resistor 36 of transceiver 28 of first CAN 14 in FIG. 3A includes a series combination of two 1.3 kΩ resistors 150 interconnecting lines 24, 26 of bus 22 with a common junction of resistors 150 being coupled to ground through a 0.1 μF capacitor 152. CAN transceiver 28 of CAN 14 of system 10' has its RS pin coupled to ground 128 through a 1 kΩ resistor 154. CAN interconnection circuit 20 of simulation system 10' of FIG. 3B is modeled to be substantially identical to circuit 20 of FIG. 2B, the only differences being that resistors 112 and capacitors 114, 116 are omitted from circuit 20 in system 10'.

Simulation system 10' is modeled with the stub resistors 52 of each of the two transceivers 44 of second CAN 18 in FIG. 3C including a series combination of two 1.3 kΩ resistors 156 interconnecting lines 40, 42 of bus 38 with a common junction of resistors 156 being coupled to ground 132 through respective 0.1 μF capacitors 158. CAN transceivers 44 of CAN 18 of system 10' each has its RS pin coupled to ground 132 through a 1 kΩ resistor 170. In the simulation system 10' of FIG. 3C, the termination resistors 50 are each modeled as a pair of parallel 120Ω resistors 160 (i.e., four total 120Ω resistors 160) with a common junction of the four resistors 160 being coupled to ground 132 through a 0.1 μF capacitor 162.

Simulation system 10' includes first, second, and third voltage sources 164, 166, 168 coupled to the TxD lines of respective transceivers 28, 44 of CAN's 14, 18. Voltage sources 164, 166, 168 are each switchable between on and off states to provide high/low pulse signals to the respective transceivers 28, 44, thereby simulating data signals occurring in the respective CAN's 14, 18. By use of simulation system 10' in this manner, it was determined that CAN interconnection circuit 20 operated for its intended purpose at the nominal 60Ω bus load of CAN 14 to pass data signals between CAN's 14, 18 without any communication failures and without experiencing a stuck state.

When terms of degree such as "generally," "substantially," and "about" are used herein in connection with a numerical value or a qualitative term susceptible to a numerical measurement, it is contemplated that an amount that is plus or minus 10 percent, and possibly up to plus or minus 20 percent, of the numerical value, is covered by such language, unless specifically noted otherwise, to at least account for manufacturing tolerances. For example, a resistor that is "about 1 kΩ" includes resistors that are from 900Ω to 1,100Ω, and possibly from 800Ω to 1,200Ω, just to give one example. Otherwise, a suitable definition for "generally," "substantially," and "about" is largely, but not necessarily wholly, the term specified.

When the terms "a" or "an" or the phrases "one or more" or "at least one" are used herein, including in the claims, they are all intended to be synonymous and mean that one or more than one of the thing recited may be present. Similarly, when the phrases "a plurality" or "two or more" or "at least two" or "a pair" are used, they are all intended to be synonymous and mean that two or more than two of the thing recited may be present.

Although certain illustrative embodiments have been described in detail above, variations and modifications exist within the scope and spirit of this disclosure as described and as defined in the following claims.

The invention claimed is:

1. A circuit for interconnecting a first controller area network (CAN) bus with a second CAN bus, the circuit comprising
   a first transmit/receive repeater,
   a second transmit/receive repeater,
   a first positive-negative-positive (PNP) transistor having a first base coupled to a first electrical line that extends between a first transmit pin of the first transmit/receive repeater and a first receive pin of the second transmit/receive repeater, the first PNP transistor further having a first collector coupled to a second electrical line that extends between a second receive pin of the first transmit/receive repeater and a second transmit pin of the second transmit receive repeater, and
   a second PNP transistor having a second base coupled to the second electrical line and a second collector coupled to the first electrical line.

2. The circuit of claim 1, wherein the first transmit/receive repeater comprises a first high speed CAN transceiver and the second transmit/receive repeater comprises a second high speed CAN transceiver.

3. The circuit of claim 1, wherein the first base is coupled to the first electrical line through a first resistor.

4. The circuit of claim 3, wherein the second receive pin is coupled to the first collector via a second resistor included in the second electrical line.

5. The circuit of claim 4, wherein the first base is coupled to a voltage source through a third resistor.

6. The circuit of claim 5, wherein the first resistor has a resistance of about 1 kilo Ohm (kΩ) and the second and third resistors each have a resistance of about 21 kΩ.

7. The circuit of claim 5, wherein a first emitter of the first PNP transistor is coupled to the voltage source.

8. The circuit of claim 1, wherein the second base is coupled to the second electrical line through a first resistor.

9. The circuit of claim 8, wherein the first receive pin is coupled to the second collector via a second resistor included in the first electrical line.

10. The circuit of claim 9, wherein the second base is coupled to a voltage source through a third resistor.

11. The circuit of claim 10, wherein the first resistor has a resistance of about 1 kΩ and the second and third resistors each have a resistance of about 21 kΩ.

12. The circuit of claim 10, wherein a first emitter of the second PNP transistor is coupled to the voltage source.

13. The circuit of claim 1, wherein the first transmit/receive repeater is electrically coupled to the first CAN bus in parallel with a termination resistor of the first CAN bus and wherein the second transmit/receive repeater is electrically coupled to the second CAN bus in parallel with a termination resistor of the second CAN bus.

14. The circuit of claim 1, wherein the circuit is devoid of any diodes coupled to the first and second PNP transistors.

15. The circuit of claim 1, wherein the circuit is devoid of any diodes coupled to the first and second electrical lines that extend between the first and second transmit/receive repeaters.

16. The circuit of claim 1, wherein the first CAN bus is included in a bed and the second CAN bus is included in a mattress supported by the bed.

17. The circuit of claim 16, wherein the first transmit/receive repeater, the second transmit/receive repeater, the first PNP transistor, and the second PNP transistor are situated within an interior region of the mattress.

18. The circuit of claim 16, further comprising one or more of the following first set of CAN nodes coupled to the first CAN bus: a main bed control board CAN node comprising a main control board of the bed with a bed microcontroller; a wireless interface board (WIB) CAN node for wireless communication; a graphical user interface (GUI) CAN node having a GUI display; a scale control CAN node to control a weigh scale system of the bed; a mattress communication CAN node to communicate with the mattress; and a bed programming CAN node used for diagnostics and programming of the bed.

19. The circuit of claim 18, further comprising one or more of the following second set of CAN nodes coupled to the second CAN bus: a main mattress control board CAN node comprising a main control board of the mattress with a mattress microcontroller; a communication CAN node for wired and wireless connectivity; and a mattress programming node used for diagnostics and programming of the mattress.

20. The circuit of claim 19, wherein one or more of the nodes of the first and second sets of CAN nodes are terminated with 120Ω resistors.

* * * * *